United States Patent
Kwon et al.

(10) Patent No.: US 12,327,181 B2
(45) Date of Patent: Jun. 10, 2025

(54) NEURAL NETWORK APPARATUS PERFORMING FLOATING-POINT OPERATION AND OPERATING METHOD OF THE SAME

(71) Applicant: Samsung Electronics Co., Ltd., Suwon-si (KR)

(72) Inventors: Soonwan Kwon, Yongin-si (KR); Minje Kim, Hwaseong-si (KR); Sangjoon Kim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1107 days.

(21) Appl. No.: 17/084,829

(22) Filed: Oct. 30, 2020

(65) Prior Publication Data
US 2021/0390382 A1    Dec. 16, 2021

(30) Foreign Application Priority Data
Jun. 12, 2020 (KR) ................ 10-2020-0071589

(51) Int. Cl.
*G06N 3/065* (2023.01)
*G06F 7/485* (2006.01)
(Continued)

(52) U.S. Cl.
CPC ............ *G06N 3/065* (2023.01); *G06F 7/485* (2013.01); *G06F 7/4876* (2013.01);
(Continued)

(58) Field of Classification Search
USPC ........................................................ 706/38
See application file for complete search history.

(56) References Cited

U.S. PATENT DOCUMENTS 9,423,999 B1    8/2016 Linzer
10,229,236 B2 *  3/2019 Elliott ................ G06F 30/3323
(Continued)

FOREIGN PATENT DOCUMENTS

CN    109901814 A    6/2019
CN    110050256 A    7/2019
(Continued)

OTHER PUBLICATIONS

Vatwani, Tarun, et al. "Floating Point Multiplication Mapping on ReRam based In-Memory Computing Architecture." *2018 31st International Conference on VLSI Design and 2018 17th International Conference on Embedded Systems (VLSID)*. IEEE, 2018. (6 pages in English).

(Continued)

*Primary Examiner* — William L Bashore
*Assistant Examiner* — Conrad R Pack
(74) *Attorney, Agent, or Firm* — NSIP Law

(57) ABSTRACT

A neural network apparatus performs multiply-accumulate (MAC) operations with respect to fractions of weights and input activations in a block floating-point format by using an analog crossbar array, performs addition operations with respect to shared exponents of weights and input activations in a block floating-point format by using a digital computing circuit, and outputs a partial sum of floating-point output activations by combining the result of the MAC operations and the result of the addition operations.

24 Claims, 15 Drawing Sheets

(51) Int. Cl.
*G06F 7/487* (2006.01)
*G06F 7/544* (2006.01)
*G06N 3/048* (2023.01)
*H03M 1/12* (2006.01)

(52) U.S. Cl.
CPC .......... *G06F 7/5443* (2013.01); *G06N 3/048* (2023.01); *H03M 1/12* (2013.01)

(56) References Cited

U.S. PATENT DOCUMENTS

| | | | |
|---|---|---|---|
| 2018/0004708 A1* | 1/2018 | Muralimanohar | G06F 17/16 |
| 2018/0046900 A1* | 2/2018 | Dally | G06F 9/3001 |
| 2018/0129893 A1* | 5/2018 | Son | G06N 3/04 |
| 2018/0157465 A1* | 6/2018 | Bittner | G06F 7/52 |
| 2019/0042199 A1 | 2/2019 | Sumbul et al. | |
| 2019/0080230 A1 | 3/2019 | Hatcher et al. | |
| 2019/0138892 A1* | 5/2019 | Kim | G06N 3/049 |
| 2019/0205741 A1* | 7/2019 | Gupta | G06F 17/13 |
| 2019/0340492 A1 | 11/2019 | Burger et al. | |
| 2019/0340499 A1 | 11/2019 | Burger et al. | |
| 2019/0347072 A1 | 11/2019 | Lo et al. | |
| 2020/0089472 A1* | 3/2020 | Pareek | G06F 7/49915 |

FOREIGN PATENT DOCUMENTS

| | | |
|---|---|---|
| CN | 110770762 A | 2/2020 |
| EP | 3 267 355 A1 | 1/2018 |
| KR | 10-2019-0029406 A | 3/2019 |
| WO | WO 2018/106526 A1 | 6/2018 |
| WO | WO 2019/027535 A1 | 2/2019 |

OTHER PUBLICATIONS

George, Arun M., Rahul Sharma, and Shrisha Rao. "IEEE 754 floating-point addition for neuromorphic architecture." *Neurocomputing* 366 (2019): 74-85. (12 pages in English).
Athreyas, Nihar, et al., "Memristor-CMOS Analog Co-Processor for Acceleration of High Performance Computing Applications", Proceeding of 2018 IEEE International Conference on Current Trends toward Converging Technologies, India, (7 pages in English).
Extended European search report issued on Dec. 16, 2021, in counterpart European Patent Application No. 20209682.2 (9 pages in English).
Chinese Office Action issued on Apr. 1, 2025, in corresponding Chinese Patent Application No. 202011402051.9. (18 pages in English, 13 pages in Chinese).
Wenbo, Che et al., "Design and Implentation of High Performance Floating-point multiply accumulate for M-DSP," Journal of Computer Applications, 36:8, Aug. 10, 2016. (pp. 2213-2218).

\* cited by examiner

NEURAL NETWORK APPARATUS PERFORMING FLOATING-POINT OPERATION AND OPERATING METHOD OF THE SAME

CROSS-REFERENCE TO RELATED APPLICATION

This application claims the benefit under 35 U.S.C. § 119 of Korean Patent Application No. 10-2020-0071589, filed on Jun. 12, 2020, in the Korean Intellectual Property Office, the entire disclosure of which is incorporated herein by reference for all purposes.

BACKGROUND

1. Field

The following description relates to a neural network apparatus performing a floating-point operation and an operating method of the same.

2. Description of Related Art

Interest in neuromorphic processors that perform neural network operations has increased. For example, research to implement a neuromorphic processor including a neuron circuit and a synaptic circuit has been conducted. A neuromorphic processor may be used in a neural network apparatus for driving various neural networks, such as a Convolutional Neural Network (CNN), Recurrent Neural Network (RNN), and Feedforward Neural Network (FNN), for use in fields including data classification or image recognition.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an operating method of a neural network apparatus performing a floating-point operation includes: determining, for each of weight kernels, a first shared exponent representing weights included in the respective weight kernel and obtaining a weight in a first block floating-point format including a first fraction adjusted based on the first shared exponent; determining, for each of a plurality of input stripes included in an input feature map, a second shared exponent representing input activations included in the respective input stripe and obtaining an input activation in a second block floating-point format including a second fraction adjusted based on the second shared exponent; performing multiply-accumulate (MAC) operations with respect to the first fraction and the second fraction using an analog crossbar array and converting a result of the MAC operations into a digital signal using an analog-digital converter (ADC); and performing addition operations with respect to the first shared exponent and the second shared exponent using a digital computing circuit and outputting a partial sum of floating-point output activations included in a channel of an output feature map by combining the result of the MAC operations and a result of addition operations.

The operating method may include storing the first fraction corresponding to each of the weights included in the respective weight kernel in memory cells arranged along a column line corresponding to the respective weight kernel among a plurality of column lines of the analog crossbar array; and inputting the second fraction corresponding to each of the input activations included in the respective input stripe to a plurality of row lines of the analog crossbar array.

The operating method may include, in a case in which the analog crossbar array supports a signed input, inputting a sign bit of the second block floating-point input activation to the plurality of row lines together with the second fraction.

The operating method may include, in a case in which the analog crossbar array supports an unsigned input, obtaining a first current sum output along each of the plurality of column lines by activating only the row lines in which a sign bit of an input activation of the second block floating-point format is a first value; and obtaining a second current sum output along each of the plurality of column lines by activating only the row lines in which a sign bit of an input activation of the second block floating point format is a second value.

The operating method may include converting the first current sum into a first digital signal using the ADC; converting the second current sum into a second digital signal using the ADC; and outputting the digital signal corresponding to the result of the MAC operations by combining the first digital signal and the second digital signal using a digital accumulator.

The operating method may include outputting a final current sum by combining the first current sum and the second current sum using an analog accumulator; and converting the final current sum into the digital signal corresponding to the result of the MAC operations using the ADC.

In a case in which the analog crossbar array supports signed weights, storing the first fraction may include storing a sign bit of a weight of the first block floating-point format in the memory cells together with the first fraction.

The operating method may include, in a case in which the analog crossbar array supports unsigned weights, storing a first fraction corresponding to each of the weights, wherein the sign bit of the first fraction is a first value in memory cells arranged along the first column lines of the analog crossbar array; storing a first fraction corresponding to each of the weights, wherein the sign bit of the first fraction is a second value in memory cells arranged along second column lines of the analog crossbar array; and outputting a final current sum by combining a first current sum output along each of the first column lines and a second current sum output along each of the second column lines.

Outputting the partial sum may include obtaining a third fraction by performing a shift operation so that the most significant bit is 1 with respect to the result of the MAC operations; obtaining a third exponent by performing a conversion operation in which a number of times the shift operation is performed is added to or subtracted from the result of the addition operations; and outputting a partial sum of the floating-point output activation including the third fraction and the third exponent.

The operating method may include determining whether the floating-point output activation is negative based on a sign bit included in the result of the MAC operations; and in response to the floating-point output activation being determined as negative, omitting the shift operation and the conversion operation and outputting the floating-point output activation as 0.

In another general aspect, a neural network apparatus performing a floating-point operation includes: at least one control circuit configured to determine a first shared exponent representing weights included in a weight kernel for each of the weight kernels, obtain a weight in a first block floating-point format including a first fraction adjusted based on the first shared exponent, for each of the plurality of input stripes included in the input feature map, determine a second shared exponent representing input activations included in the input stripe; and obtain an input activation in a second block floating-point format including a second fraction adjusted based on the second shared exponent; an in-memory computing circuit comprising an analog crossbar array configured to perform multiply-accumulate (MAC) operations with respect to a first fraction and a second fraction and an analog-digital converter (ADC) configured to convert the result of the MAC operations into a digital signal; and a digital computing circuit configured to perform an addition operation with respect to the first shared exponent and the second shared exponent and to output a partial sum of a floating-point output activation included in a channel of an output feature map by combining the result of the MAC operations and the result of the addition operation.

The analog crossbar array may include: a plurality of row lines; a plurality of column lines crossing the plurality of row lines; and a plurality of memory cells disposed at intersections of the plurality of row lines and the plurality of column lines. The at least one control circuit may be configured to: store the first fraction corresponding to each of the weights included in the weight kernel in memory cells arranged along a column line among the plurality of column lines corresponding to the respective weight kernel, and input a second fraction corresponding to each of the input activations included in the respective input stripe to the plurality of row lines.

In a case in which the analog crossbar array supports signed input, the at least one control circuit may be configured to input a sign bit of an input activation in a second block floating-point format to the plurality of row lines together with the second fraction.

In a case in which the analog crossbar array supports unsigned input, the at least one control circuit may be configured to obtain a first current sum output along each of the plurality of column lines by activating only the row lines in which a sign bit of the input activation of the second block floating-point format is a first value, and a second current sum output along each of the plurality of column lines by activating only the row lines in which a sign bit of the input activation of the second block floating-point format is a second value.

The ADC may be configured to convert the first current sum into a first digital signal and convert the second current sum into a second digital signal, and the neural network apparatus may include a digital accumulator configured to output the digital signal corresponding to the result of the MAC operations by combining the first digital signal and the second digital signal.

The neural network apparatus may include: an analog accumulator configured to output a final current sum by combining the first current sum and the second current sum, and the ADC may be configured to convert the final current sum into the digital signal corresponding to the result of the MAC operations.

In a case in which the analog crossbar array supports signed weights, the at least one control circuit may be configured to store a sign bit of a weight of the first block floating-point format in the memory cells together with the first fraction.

In a case in which the analog crossbar array supports unsigned weights, the at least one control circuit may be configured to store a first fraction corresponding to each of the weights in which a sign bit is a first value in memory cells arranged along the first column lines of the analog crossbar array, and store a first fraction corresponding to each of the weights in which a sign bit is a second value in the memory cells arranged along the second column lines of the analog crossbar array, and the in-memory computing circuit may be configured to output a final current sum by combining a first current sum output along each of the first column lines and a second current sum output along each of the second column lines.

The digital computing circuit may be configured to obtain a third fraction by performing a shift operation so that the most significant bit is 1 with respect to the result of the MAC operations, obtain a third exponent by performing a conversion operation in which a number of times the shift operation is performed is added to or subtracted from the addition operation, and obtain a partial sum of the floating-point output activation including the third fraction and the third exponent.

The digital computing circuit may be configured to determine whether the floating-point output activation is negative based on a sign bit included in the result of the MAC operations, and in response to the floating-point output activation being determined as negative, omit the shift operation and the conversion operation and output the floating-point output activation as 0.

In another general aspect, a neural network apparatus includes: at least one control circuit configured to output a first shared exponent among weights included in a plurality of weight kernels and first fractions of the weights that have been adjusted through a shift operation, and to output a second shared exponent among input stripes included in an input feature map and second fractions corresponding to input activations included in the input stripes; an in-memory computing circuit configured to perform multiply-accumulate (MAC) operations with respect to the first fractions and the second fractions and to convert a result of the MAC operations into a digital signal; and a digital computing circuit configured to perform addition operations with respect to the first shared exponent and the second shared exponent and to output a partial sum of a floating-point output activation included in a channel of an output feature map by combining the digital signal and a result of the addition operations.

The first shared exponent may be a maximum value among existing exponents of the weights.

The in-memory computing circuit may include an analog crossbar array configured to perform the MAC operations and an analog-digital converter (ADC) configured to convert the result of the MAC operations into the digital signal.

The neural network apparatus may include an accumulator configured to combine first digital signals corresponding to positive input activations and second digital signals corresponding to negative input activations.

The accumulator may be an analog accumulator included in the in-memory computing circuit.

The accumulator may be a digital accumulator included in the digital computing circuit.

Other features and aspects will be apparent from the following detailed description, the drawings, and the claims.

Figure 1:
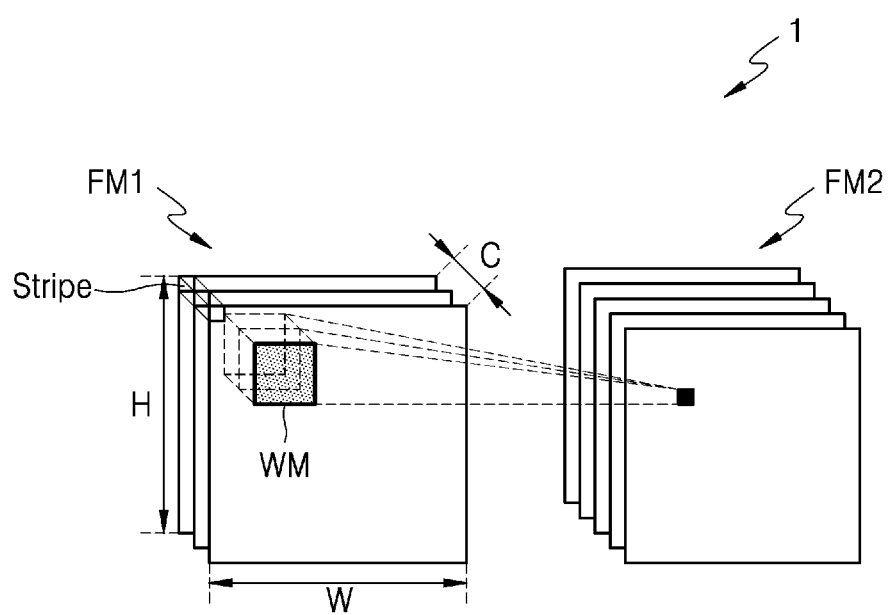
FIG. 1 is a diagram for explaining an architecture of a neural network according to some examples.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when a component is described as being "connected to," or "coupled to" another component, it may be directly "connected to," or "coupled to" the other component, or there may be one or more other components intervening therebetween. In contrast, when an element is described as being "directly connected to," or "directly coupled to" another element, there can be no other elements intervening therebetween. Likewise, similar expressions, for example, "between" and "immediately between," and "adjacent to" and "immediately adjacent to," are also to be construed in the same way. As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application and are not to be interpreted in an idealized or overly formal sense unless expressly so defined herein. The use of the term "may" herein with respect to an example or embodiment (e.g., as to what an example or embodiment may include or implement) means that at least one example or embodiment exists where such a feature is included or implemented, while all examples are not limited thereto.

FIG. 1 is a diagram for explaining an architecture of a neural network 1 according to some examples.

Referring to FIG. 1, the neural network 1 may be represented by a mathematical model by using nodes and edges. The neural network 1 may include an architecture of a deep neural network (DNN) or n-layers neural networks. The DNN or n-layers neural networks may correspond to convolutional neural networks (CNNs), recurrent neural networks (RNNs), deep belief networks, restricted Boltzman machines, etc. For example, the neural network 1 may be implemented as a CNN, but is not limited thereto. The neural network 1 of FIG. 1 may correspond to some layers of the CNN. Accordingly, the neural network 1 may correspond to a convolutional layer, a pooling layer, or a fully connected layer, etc. of a CNN. However, for convenience, in the following descriptions, it is assumed that the neural network 1 corresponds to the convolutional layer of the CNN.

In the convolution layer, a first feature map FM1 may correspond to an input feature map, and a second feature map FM2 may correspond to an output feature map. The feature map may denote a data set representing various characteristics of input data. The first and second feature maps FM1 and FM2 may be a high-dimensional matrix of two or more dimensions, and have respective activation parameters. When the first and second feature maps FM1 and FM2 correspond to, for example, three-dimensional feature maps, the first and second feature maps FM1 and FM2 have a width W (or column), a height H (or row), and a depth C. At this point, the depth C may correspond to the number of channels.

The first feature map FM1 may include a plurality of input stripes. For example, the first feature map FM1 may include H×W input stripes. The input stripe is channel direction input data with respect to one space of the input feature map, and may have a size of 1×1×C. For example, the input stripe may include C input activations.

In a convolution layer, a convolution operation with respect to the first feature map FM1 and a weight map WM may be performed, and as a result, the second feature map FM2 may be generated. The weight map WM may filter the first feature map FM1 and is referred to as a filter or kernel. In one example, a depth of the weight map WM, that is, the number of channels is the same as the depth D of the first feature map FM1, that is, the number of channels. The weight map WM is shifted by traversing the first feature map FM1 as a sliding window. In each shift, weights included in the weight map WM may respectively be multiplied and added to all feature values in a region overlapping with the first feature map FM1. As the first feature map FM1 and the weight map WM are convolved, one channel of the second feature map FM2 may be generated.

In FIG. 1, although one weight map WM is depicted, substantially a plurality of channels of the second feature map FM2 may be generated by convolving the plurality of weight maps with the first feature map FM1. The second feature map FM2 of the convolution layer may be an input feature map of the next layer. For example, the second feature map FM2 may be an input feature map of a pooling layer.

Figure 2:
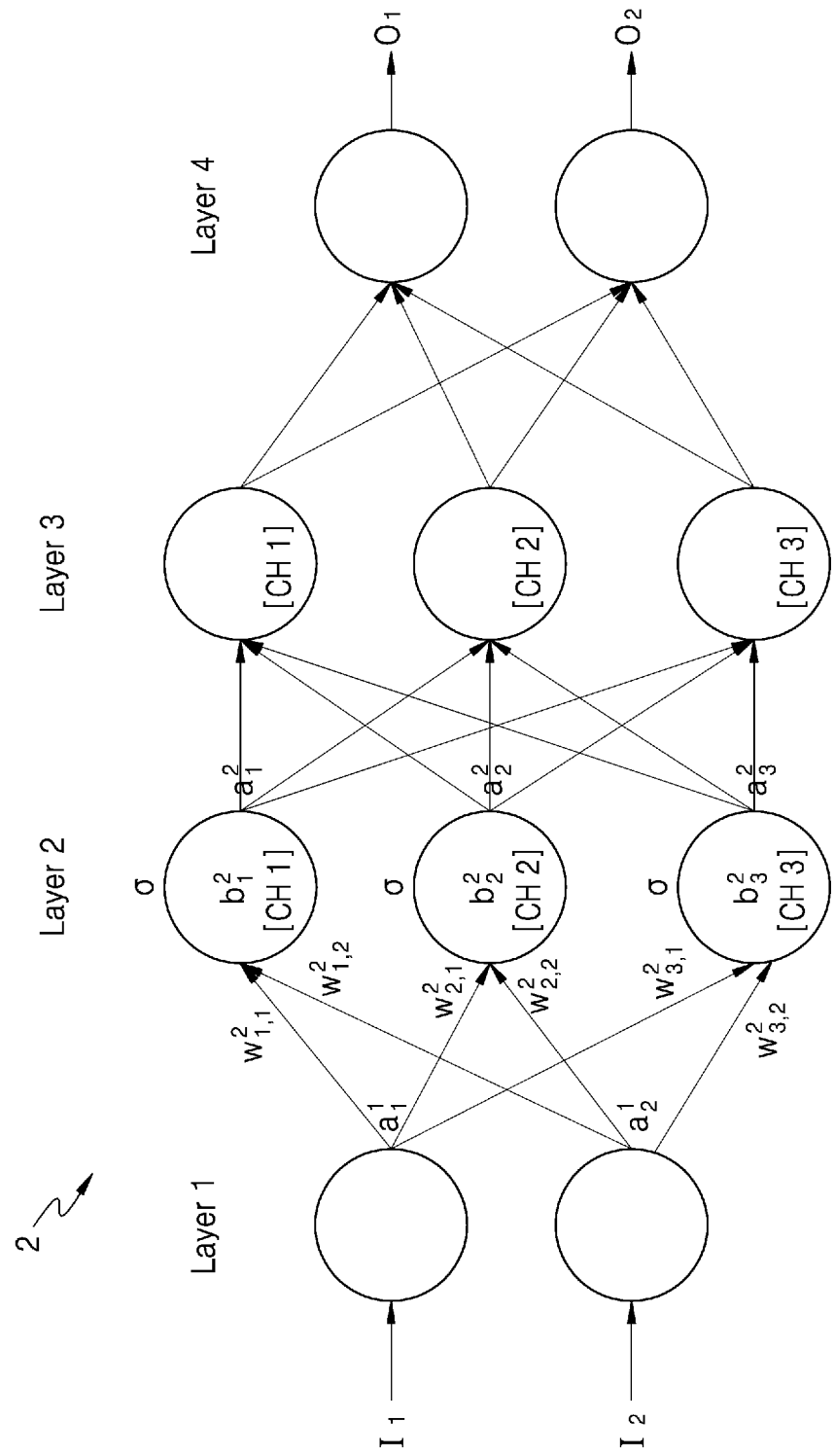
FIG. 2 is a diagram for explaining an operation performed in a neural network according to some examples.

FIG. 2 is a diagram for explaining an operation performed in a neural network 2 according to some examples.

Referring to FIG. 2, the neural network 2 has a structure including input layers, hidden layers, and output layers, and performs operations based on received input data (for example, $I_1$ and $I_2$), and may generate output data (for example, $O_1$ and $O_2$) based on a result of the operations.

As described above, the neural network 2 may be a DNN or an n-layer neural network including two or more hidden layers. For example, as illustrated in FIG. 2, the neural network 2 may be a DNN including an input layer (Layer 1), two hidden layers (Layer 2 and Layer 3), and an output layer (Layer 4). When the neural network 2 is implemented as a DNN architecture, the neural network 2 includes a further large number of layers capable of processing valid information, and thus, the neural network 2 may process a larger number of complex data sets than a neural network having a single layer. However, although the neural network 2 is illustrated as including four layers, this is only an example, and the neural network 2 may include a small or large number of layers, or a small or large number of channels. That is, the neural network 2 may include layers of various structures different from those illustrated in FIG. 2.

Each of the layers included in the neural network 2 may include a plurality of channels. A channel may correspond to a plurality of artificial nodes, known as neurons, processing elements (PEs), units, or similar terms. For example, as illustrated in FIG. 2, the Layer 1 may include two channels (nodes), and each of the Layer 2 and Layer 3 may include three channels. However, this is only an example, and each of the layers included in the neural network 2 may include various numbers of channels (nodes).

The channels included in each of the layers of the neural network 2 may be connected to each other to process data. For example, one channel may receive data from other channels for operation and output the operation result to other channels.

Each of inputs and outputs of each of the channels may be referred to as an input activation and an output activation. That is, the activation may be an output of one channel and may be a parameter corresponding to an input of channels included in the next layer. Meanwhile, each of the channels may determine its own activation based on activations and weights received from channels included in the previous layer. The weight is a parameter used to operate an output activation in each channel, and may be a value assigned to a connection relationship between channels.

Each of the channels may be processed by a computational unit or a processing element that outputs an output activation by receiving an input, and an input-output of each of the channels may be mapped. For example, when σ is an activation function, $w_{jk}^i$ is a weight from a $k^{th}$ channel included in an $(i-1)^{th}$ layer to a $j^{th}$ channel included in an $i^{th}$ layer, $b_j^i$ is a bias of the $j^{th}$ channel included in the $i^{th}$ layer, and $a_j^i$ is an activation of the $j^{th}$ channel in the $i^{th}$ layer, the activation may be calculated by using Equation 1 below.

$$a_j^i = \sigma\left(\sum_k (w_{jk}^i \times a_k^{i-1}) + b_j^i\right) \quad \text{Equation 1}$$

As shown in FIG. 2, the activation of a first channel CH1 of the second layer Layer 2 may be expressed $a_1^2$. Also, $a_1^2$ may have a value of $a_1^2 = \sigma(w_{1,1}^2 \times a_1^1 + w_{1,2}^2 \times a_2^1 + b_1^2)$ according to the Equation 1. The activation function a may be a Rectified Linear Unit (ReLU), but the configuration is not limited thereto. For example, the activation function a may be sigmoid, hyperbolic tangent, Maxout, etc.

As described above, in the neural network 2, a large number of data sets are exchanged between a plurality of interconnected channels, and a number of computational processes are performed through layers. In this operation, a large number of MAC (Multiply-accumulate) operations are performed, and a large number of memory access operations must be performed to load activations and weights, which are operands of MAC operations, at an appropriate time.

On the other hand, a typical digital computer uses a Von Neumann structure in which a computation unit and a memory are separated and includes a common data bus for data transmission between two separated blocks. Accordingly, in the process of performing the neural network 2 in which data movement and operation are continuously repeated, a lot of time is required to transmit data and excessive power may be consumed. To overcome this problem, an in-memory computing circuit has been proposed as an architecture for integrating a memory and a computation unit for performing a MAC operation into one. Hereinafter, the in-memory computing circuit will be described more in detail with reference to FIG. 3.

Figure 3:
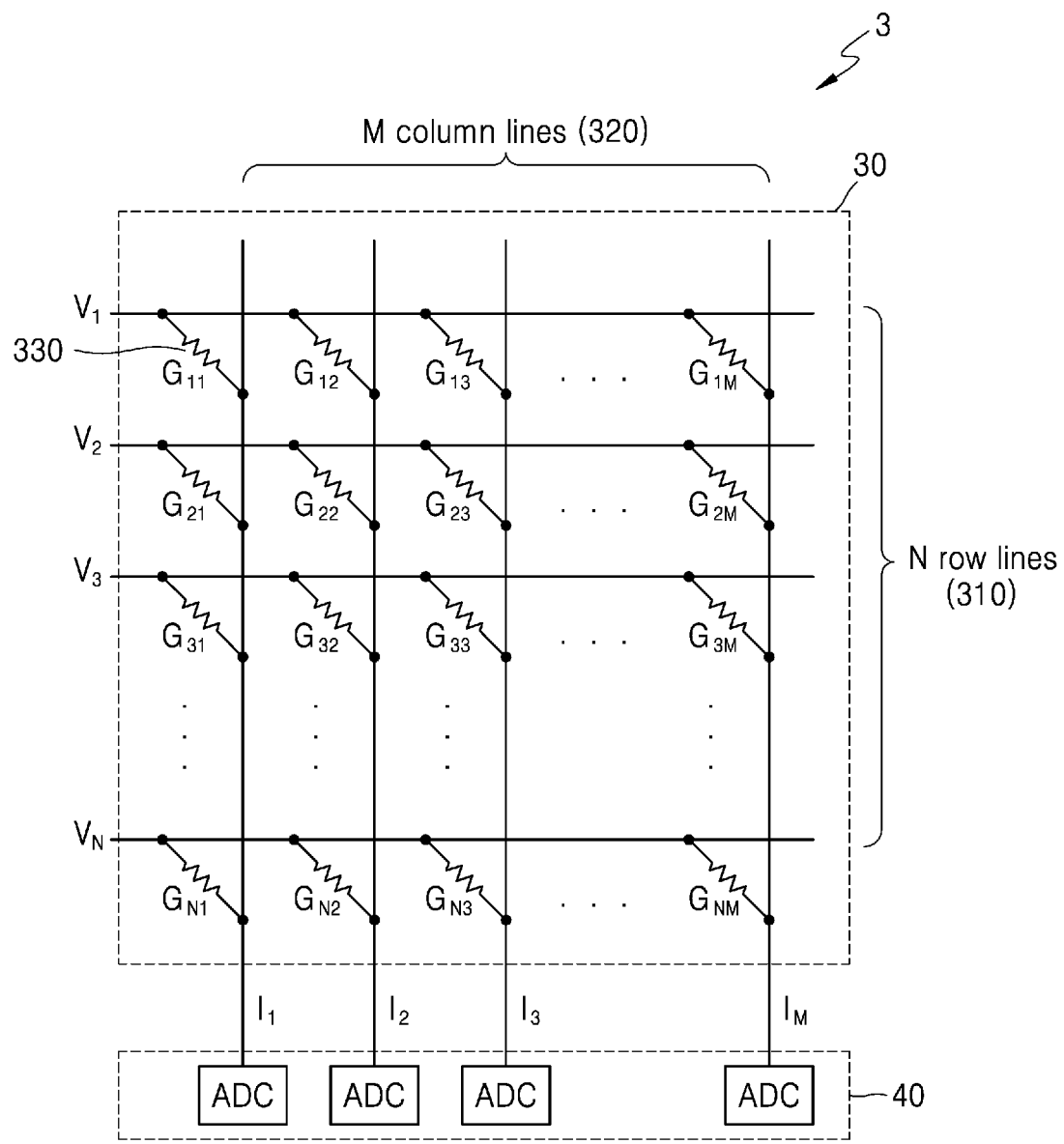
FIG. 3 is a diagram illustrating an in-memory computing circuit according to some examples.

FIG. 3 is a diagram illustrating an in-memory computing circuit 3 according to some examples.

Referring to FIG. 3, the in-memory computing circuit 3 may include an analog crossbar array 30 and an analog to digital converter (ADC) 40. However, only components related to the present examples are depicted in the in-memory computing circuit 3 illustrated in FIG. 3. Accordingly, it will be apparent to those of skill in the art that the in-memory computing circuit 3 may further include other general-purpose components in addition to the components shown in FIG. 3.

The analog crossbar array 30 may include a plurality of row lines 310, a plurality of column lines 320, and a plurality of memory cells 330. The plurality of row lines 310 may be used to receive input data. For example, when the plurality of row lines 310 is N (N is an arbitrary natural number) row lines, voltages $V_1, V_2, \ldots, V_N$ corresponding to input activations may be applied to the N row lines. The plurality of column lines 320 may cross the plurality of row lines 310. For example, when the plurality of column lines 320 are M (M is an arbitrary natural number) column lines, the plurality of column lines 320 and the plurality of row lines 310 may cross at N×M intersections.

Meanwhile, a plurality of memory cells 330 may be arranged at intersections of the plurality of row lines 310 and the plurality of column lines 320. Each of the plurality of memory cells 330 may be implemented as a nonvolatile memory, such as Resistive RAM (ReRAM) or eFlash to store weights, but is not limited thereto. Each of the plurality of memory cells 330 may be a volatile memory, such as static random access memory (SRAM).

In the analog crossbar array 30 illustrated in FIG. 3, the plurality of memory cells 330 may include conductances $G_{11}, \ldots, G_{NM}$ corresponding to weights, when a voltage corresponding to an input activation is applied to each of the plurality of row lines 310, according to Ohm's law, a current having a size of I=V×G may be output through each memory cell 330. Since currents output from the memory cells arranged in one column line are summed together, the current sums $I_1, \ldots, I_M$ may be output along the plurality of column lines 320. The current sums $I_1, \ldots, I_M$ may correspond to the result of a MAC operation performed in an analog method.

The ADC 40 may convert the result of an analog MAC operation output from the analog crossbar array 30 (that is, the current sum $I_1, \ldots, I_M$) into a digital signal. The result of the MAC operation converted to a digital signal is output from the ADC 40 and may be used in a subsequent neural network operation process.

On the other hand, as shown in FIG. 3, the in-memory computing circuit 3 has the advantages of lower complexity of the core operation unit, less power consumption, and smaller circuit size than a digital computer, but may perform only a fixed-point based operation and may be difficult to perform a floating-point based operation supporting a large dynamic range.

Accordingly, in the related art, after performing a training with respect to a neural network on a floating-point base, the trained neural network was quantized and converted into a fixed-point format and the in-memory computing circuit 3 was used only in the process of implementing the quantized neural network. However, according to the related art, an accuracy loss may occur in the process of quantizing a neural network, or a re-training may be required to minimize the loss of accuracy. Also, the neural network that implements a specific application has a very large dynamic range of parameters, and thus, it is impossible to have a quantization while minimizing the loss of accuracy.

According to the present example, a neural network apparatus capable of performing a floating-point based operation while utilizing the in-memory computing circuit 3 having various advantages may be provided. Hereinafter, a method of performing a floating-point operation by a neural network apparatus according to some examples will be described in detail with reference to the drawings.

Figure 4:
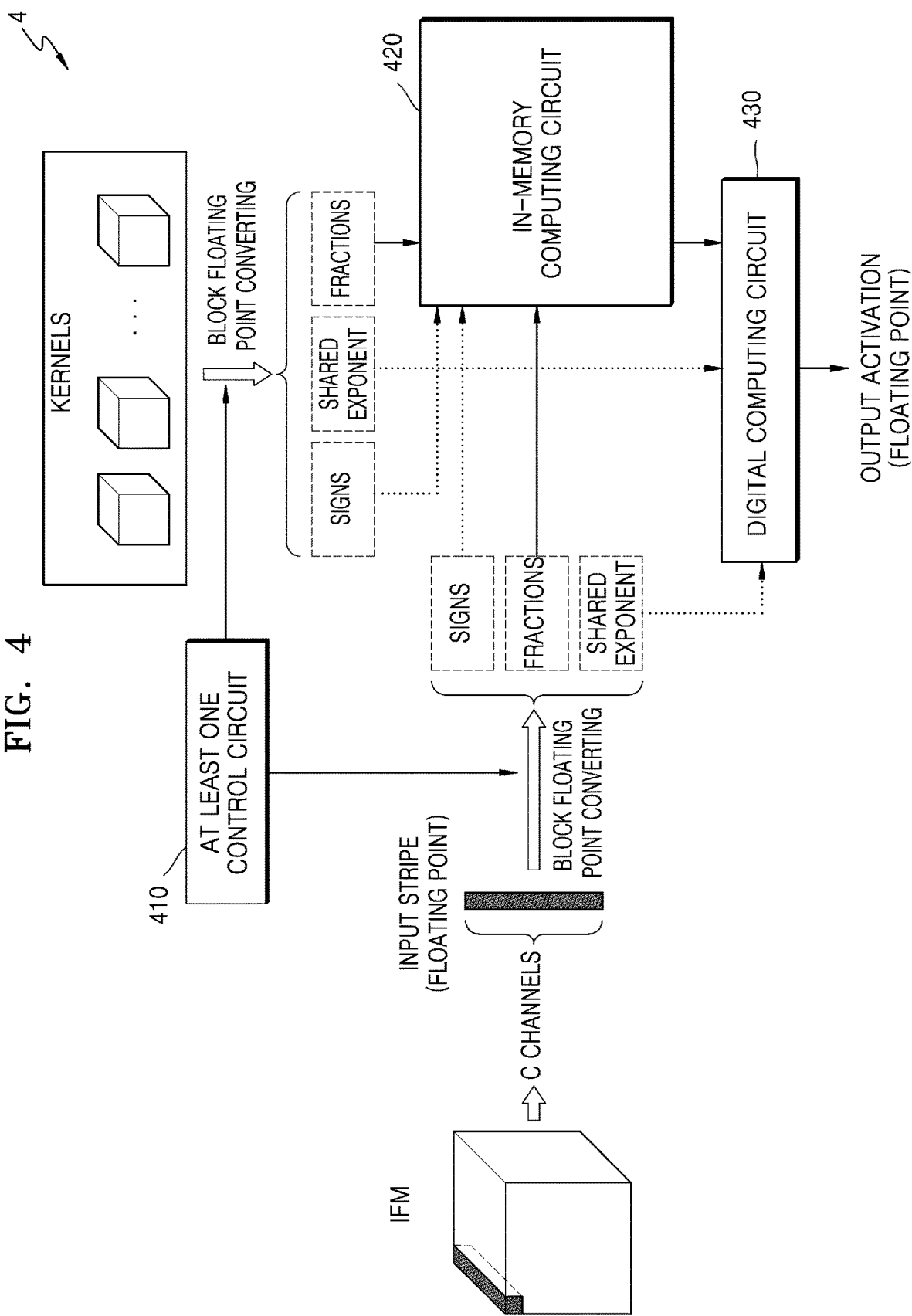
FIG. 4 is a schematic diagram illustrating an overall process of performing floating-point operations by a neural network apparatus according to some examples.

FIG. 4 is a schematic diagram illustrating an overall process of performing floating-point operations by a neural network apparatus 4 according to some examples.

Referring to FIG. 4, the neural network apparatus 4 may include at least one control circuit 410, an in-memory computing circuit 420, and a digital computing circuit 430. However, only components related to the present examples are depicted in the neural network apparatus 4 shown in FIG. 4. Accordingly, it is apparent to those of skill in the art that the neural network apparatus 4 may further include other general-purpose components in addition to the components shown in FIG. 4.

The at least one control circuit 410 performs an overall function for controlling the neural network apparatus 4. For example, the at least one control circuit 410 may control operations of the in-memory computing circuit 420 and the digital computing circuit 430. Meanwhile, the at least one control circuit 410 may be implemented as an array of multiple logic gates, or may be implemented as a combination of a general-purpose microprocessor and a memory in which programs that may be executed in the microprocessor are stored.

The at least one control circuit 410 may determine, with respect to each of weight kernels, a first shared exponent representing weights included in the weight kernel, and may obtain a weight in a first block floating-point format including a first fraction adjusted based on the first shared exponent. Hereinafter, a method in which the at least one control circuit 410 obtains a block floating-point weight will be described in more detail with reference to FIGS. 5, 6A, and 6B.

Figure 5:
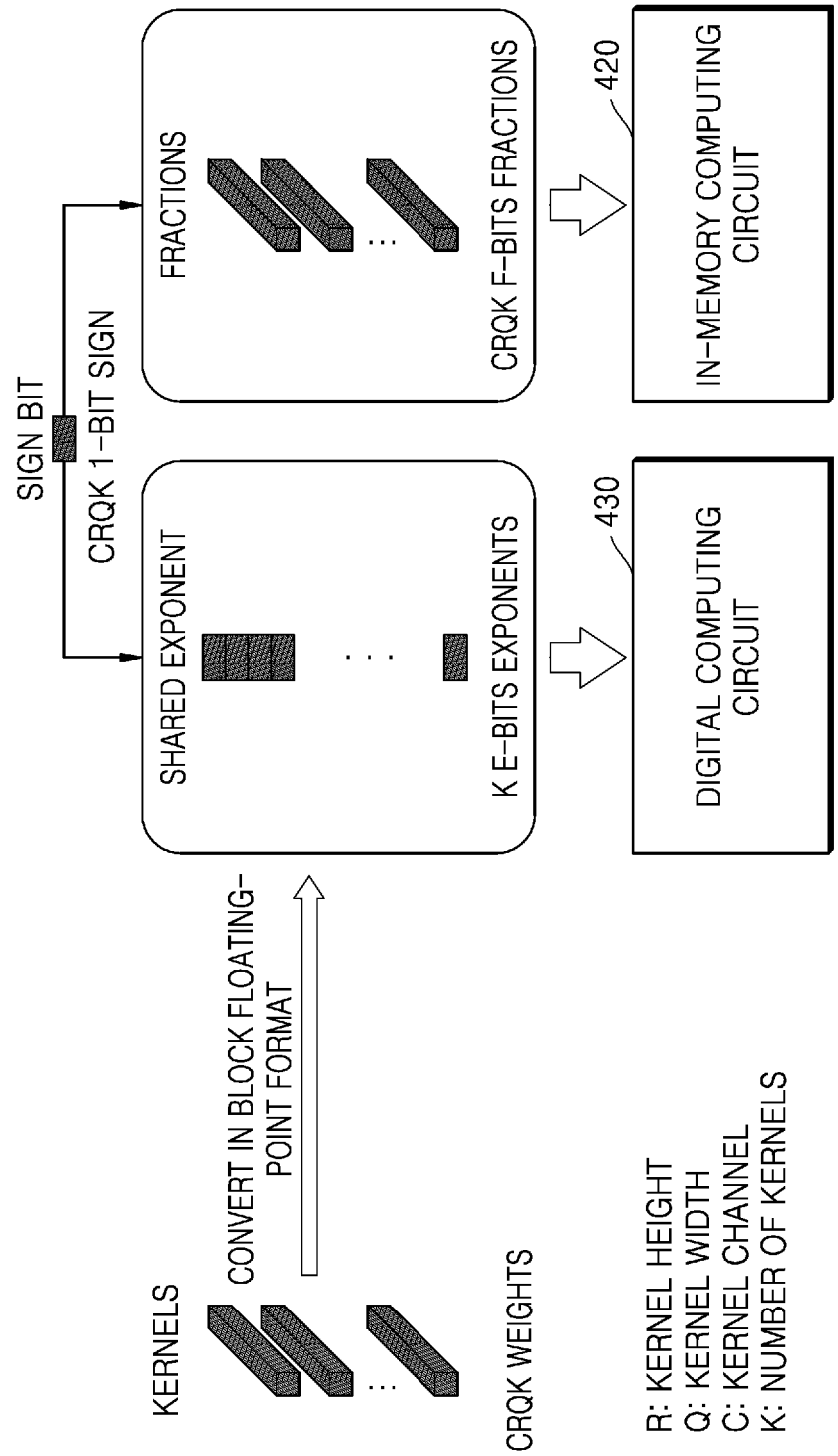
FIG. 5 is a diagram illustrating a process of converting weights into a block floating-point by a neural network apparatus according to some examples.

FIG. 5 is a diagram illustrating a process of converting weights into a block floating-point by a neural network apparatus according to some examples.

Referring to FIG. 5, when the height of the weight kernel is R, the width of the weight kernel is Q, the depth of the weight kernel (i.e., the number of channels) is C, and the number of weight kernels is K, a process of converting CRQK weights included in the weight kernels into a block floating-point format is illustrated.

Since the neural network apparatus according to some examples intends to perform a floating-point operation with low power by utilizing an in-memory computing circuit (for example, the in-memory computing circuit 420 of FIG. 4) that may perform only fixed-point based operations, it is necessary to separate a portion of the floating-point weights that may be computed using the in-memory computing circuit 420.

Weights included in the weight kernels are data of a floating-point format, and may have the same or different exponents according to the size of each value, and for efficient operation, a block floating-point format that shares an exponent for each block of a specific size may be used. For example, as illustrated in FIG. 5, a shared exponent may be extracted for each weight kernel, and weights included in one weight kernel may share the same exponent. Meanwhile, in order to express all the weights included in the weight kernel, the shared exponent may be determined as a maximum value among existing exponents of weights, but is not limited thereto. As an exponent of a weight is changed from an existing exponent to a shared exponent, a fraction of the weight may also be adjusted through a corresponding shift operation.

As illustrated in FIG. 5, when CRQK weights are converted into a block floating-point format in a weight kernel unit, the CRQK weights may be represented as only CRQK sign bits, K shared exponents, and CRQK fractions. The K shared exponents may be input to the digital computing circuit 430 and may be used for digital computation, and the CRQK fractions may be input to the in-memory computing circuit 420 may be used for analog computation. Hereinafter, a method of storing the shared exponents and fractions to be respectively used for a digital operation and an analog operation will be described below with reference with reference to FIGS. 6A and 6B.

Figure 6A:
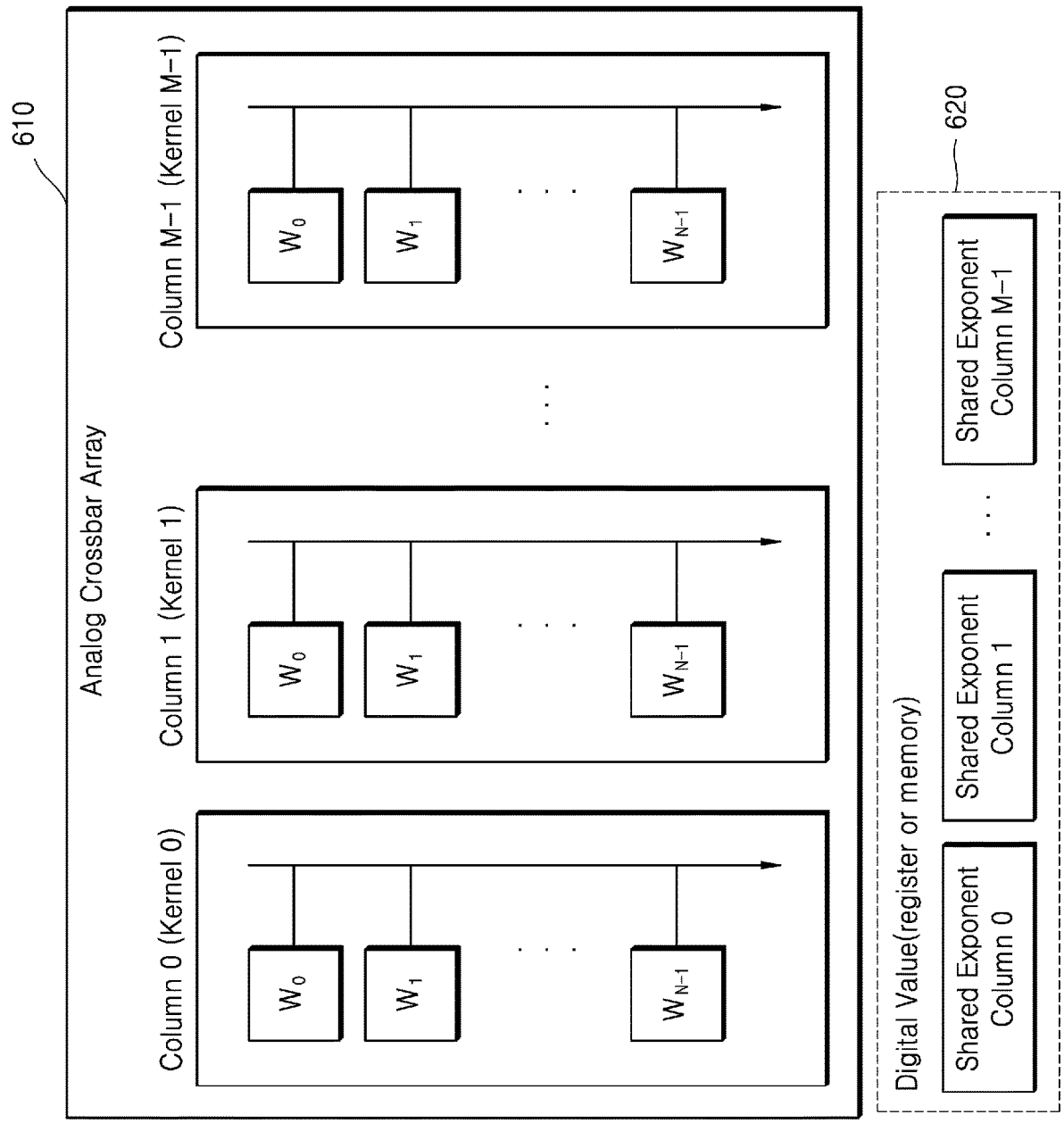
FIG. 6A is a diagram for explaining a method of storing weights converted into a block floating-point according to some examples.
Figure 6B:
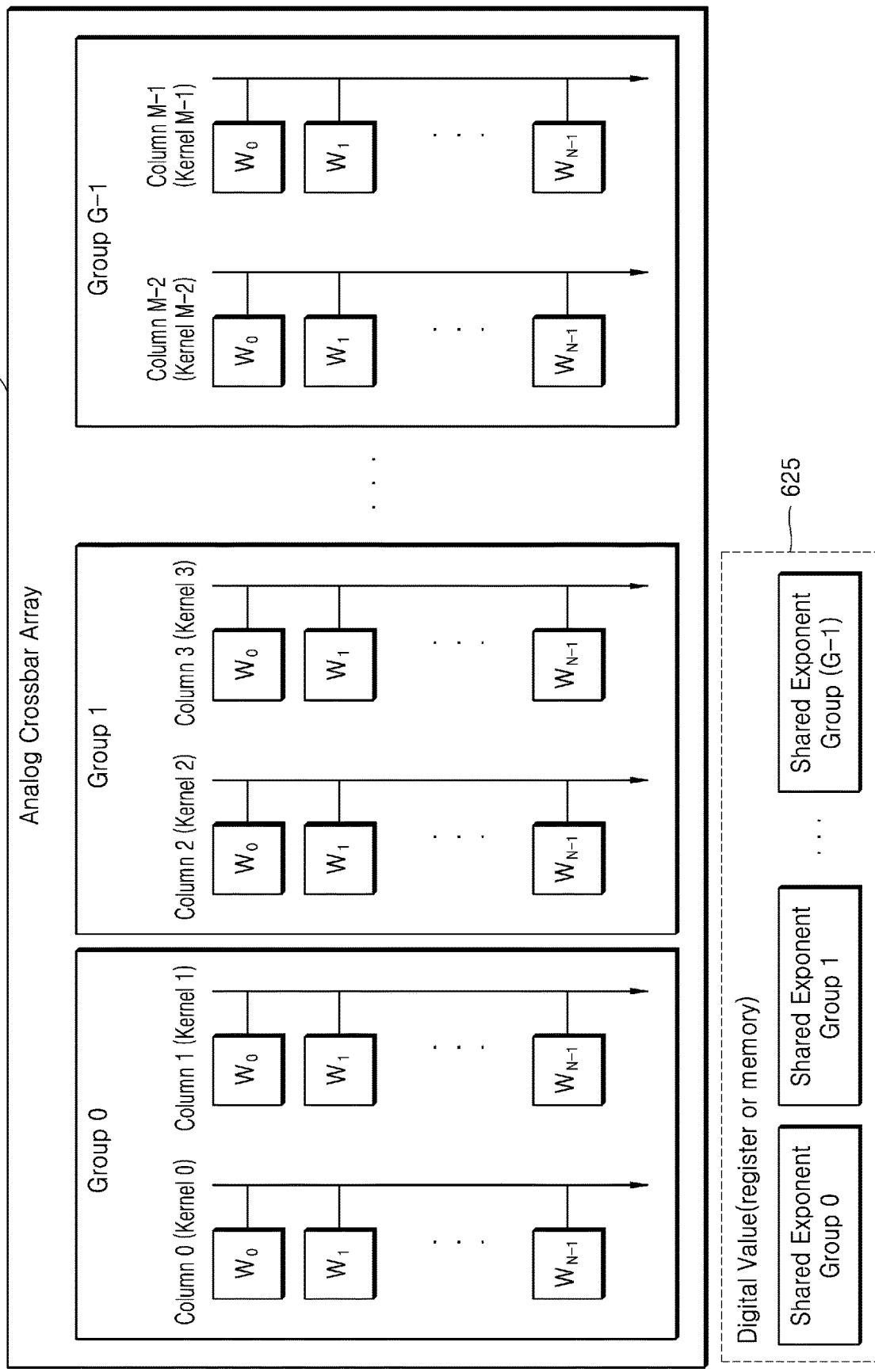
FIG. 6B is a diagram for explaining a method of storing weights converted into a block floating-point according to another example.

FIG. 6A is a diagram for explaining a method of storing weights converted to a block floating-point according to some examples, and FIG. 6B is a diagram for explaining a method of storing weights converted to a block floating-point according to another example.

Each of an analog crossbar array 610 of FIG. 6A and an analog crossbar array 615 of FIG. 6B corresponds to the analog crossbar array 30 of FIG. 3, and each of a digital computing circuit 620 of FIG. 6A and a digital computing circuit 625 of FIG. 6B corresponds to the digital computing circuit 430 of FIG. 4, and thus, descriptions already given will be omitted.

Referring to FIG. 6A, as described with reference to FIG. 5, when weights are converted to have a shared exponent for each weight kernel, a method of storing shared exponents and fractions of weights for a specific layer is illustrated.

In an example, $W_{n,i,k}$ that represents a weight included in an $n^{th}$ layer, an $i^{th}$ input channel, and a $k^{th}$ weight kernel may be expressed as Equation 2 below.

$$W_{n,i,k}=(-1)^{S_W}\times 2^{E_{W(n,k)}}\times F_{W(n,i,k)} \quad \text{Equation 2:}$$

$F_{W(n,i,k)}$ represents a fraction of the weight. In an example in which the weight is a 16-bit floating-point, a sign bit includes 1 bit and the shared exponent includes e bits, and the fraction includes f bits (1+e+f=16). In Equation 2, an exponent bias is not included for convenience of explanation, but when the exponent bias $b_w$ is included, $E_{W(n,k)}$ may be modified to $E_{W(n,k)}-b_W$. On the other hand, an input activation may also include an exponent bias, and in this case, Equation 3, which will be described below, may be modified in the same manner as when an exponent bias is included in the weight. Also, when the Equations 2 and 3 are modified in consideration of exponent biases, those of skill in the art may readily understand that Equation 4, which will be described below, may also be modified to correspond to the modifications of the Equations 2 and 3.

The fraction $F_{(W(n,i,k)}$ of weights of a block floating-point format may be stored in the analog crossbar array 610. For example, assuming that when the analog crossbar array 610 includes M column lines, each of the M column lines may correspond to each of the M weight kernels, and weights included in the weight kernel may be stored in memory cells arranged along the corresponding column lines. Weights each composed of f bits are stored as many as the number of kernels (i.e., M) in a stripe unit having a size of N.

Meanwhile, the shared exponent $E_{W(n,k)}$ extracted from the weights may be separately stored in the digital calculation circuit 620. The digital computing circuit 620 may include a register or a memory for storing digital values corresponding to the shared exponents. The shared exponents, each composed of e bits, are stored as many as the number of kernels (i.e., M), and thus, total e×M bits are stored.

When the analog crossbar array 610 supports signed weights, only $E_{W(n,k)}$ is separately stored in a storage space of the digital computing circuit 620, and a sign bit $S_W$ of the weight may be stored in the analog crossbar array 610. However, when the analog crossbar array 610 supports unsigned weights, $S_W$ together with $E_{W(n,k)}$ may be stored in an additional storage space of the digital computing circuit 620 besides the analog crossbar array 610.

In the above, a case when weights are converted to have a shared exponent for each weight kernel has been described with reference to FIG. 6A, but this is only an example. Weights may be converted to have a shared exponent for each group, not for each weight kernel. For example, as illustrated in FIG. 6B, a specific number of columns (i.e., weight kernels) included in the analog crossbar array 615 may be combined into one group, and a shared exponent may be extracted for each group. In this case, the number of shared exponents for representing total weights may be reduced, and an amount of computation in a process of converting an output of the analog crossbar array 615 to a final output may be reduced.

However, when an excessively large number of columns are combined into one group, the accuracy loss may be increased, and thus, the number of groups may be appropriately set in consideration of a tradeoff between accuracy loss and computation amount. In one example, since weights correspond to data that a neural network apparatus knows in advance, the neural network apparatus may determine an appropriate number of groups through simulation in advance. However, the configuration is not necessarily limited thereto, and the number of groups may be determined in real time. Also, types of columns included in one group may also be determined together with the number of groups.

Meanwhile, shared exponents extracted from weights may be separately stored in the digital computing circuit 625. The digital computing circuit 625 may include a register or a memory for storing digital values corresponding to the shared exponents. The shared exponents may be stored as many as the number of groups (i.e., G).

According to some examples, in a case where the analog crossbar array 615 amplifies a sensed current or an input voltage by a preset amplification factor, an amplification factor corresponding to a difference in a shared exponent between specific groups may be allocated to the amplification factor of the analog crossbar array 615, and thus, the shared exponent between the corresponding groups may be unified. For example, when the analog crossbar array 615 may amplify a sensed current twice and a difference between a shared exponent to be assigned to the first group and a shared exponent to be assigned to a second group is 1, instead of allocating different shared exponents to the first group and the second group, the same shared exponent is allocated to the first and second groups, but when acquiring a current sum corresponding to the first group, the sensed current may be doubled. Accordingly, the number of shared exponents for representing total weights may further be reduced.

On the other hand, the configuration is not limited to the previous example, and it will be easily understood by those of skill in the art that instead of amplifying the sensed current, an input voltage may be amplified or both the sensed current and the input voltage may be amplified, and the amplification factor may be variously set to 4, 8, etc., instead of 2. If it is possible to amplify each of the sensed current and the input voltage, and the amplification factor may also select one of several amplification factors, the number of shared exponents for representing total weights may further be reduced.

Returning to FIG. 4, the at least one control circuit 410 may determine, with respect to each of a plurality of input stripes included in an input feature map, a second shared exponent representing input activations included in the input stripe, and may obtain an input activation in a second block floating-point format including an adjusted second fraction based on the second shared exponent. Hereinafter, a method in which the at least one control circuit 410 obtains a block floating-point input activation will be described in more detail with reference to FIG. 7.

Figure 7:
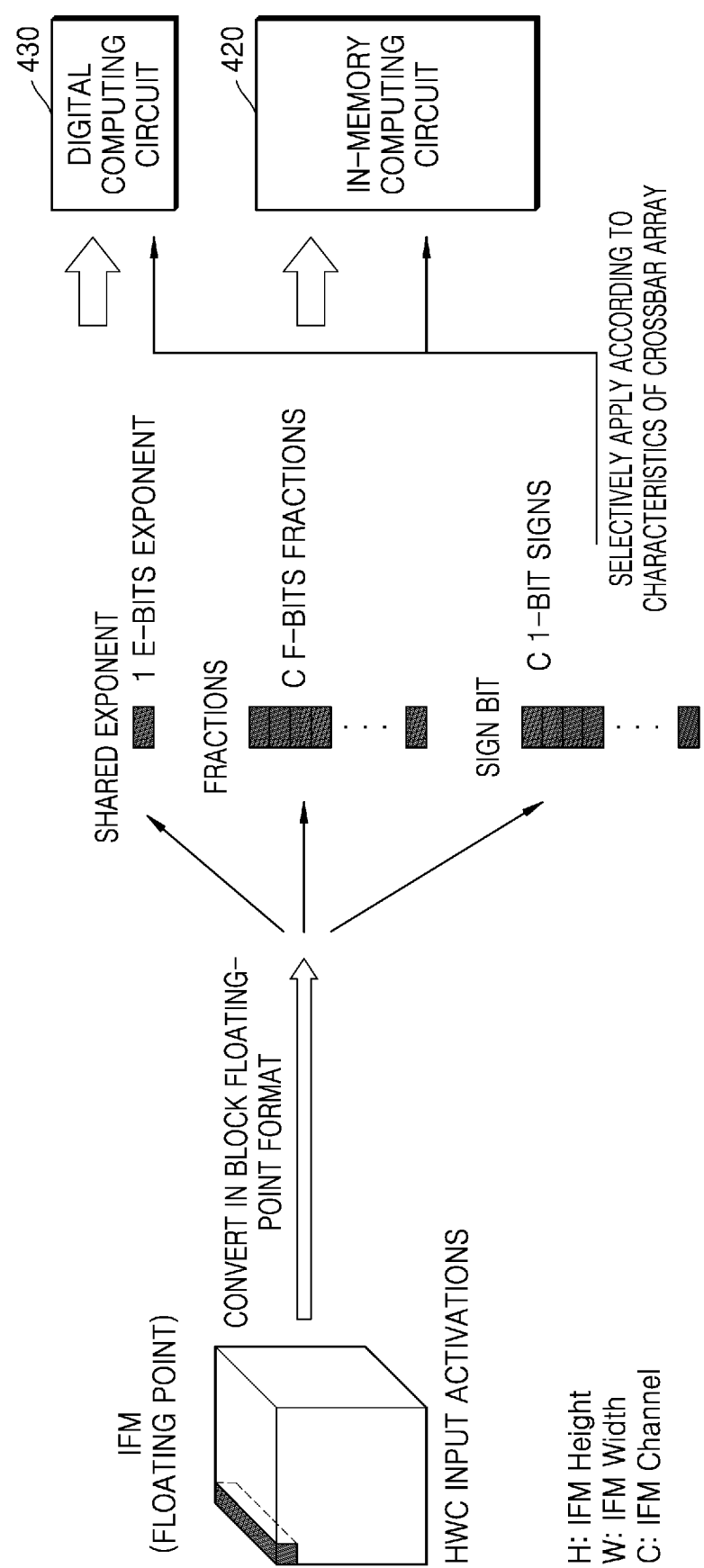
FIG. 7 is a diagram for explaining a process of converting input activations into a block floating-point by a neural network apparatus according to some examples.

FIG. 7 is a diagram for explaining a process of converting input activations to a block floating-point by a neural network apparatus according to some examples.

Referring to FIG. 7, when the height of an input feature map IFM is H, the width of the input feature map IFM is W, and the depth (i.e., the number of channels) of the input feature map IFM is C, a process of converting HWC input activations included in the feature map IFM into a block floating-point format is illustrated.

Input activations included in the input feature map IMF may be converted into a block floating-point format in an input stripe unit. For example, as illustrated in FIG. 7, when input activations are converted into a block floating-point format of an input stripe unit, input activations included in one input stripe may be represented by only one shared exponent. One shared exponent corresponding to one input stripe may be input to the digital computing circuit 430 and used for digital computation, and C fractions corresponding to one input stripe may be input to the in-memory computing circuit 420 and used for analog computation. C sign bits corresponding to one input stripe, according to the characteristics of a crossbar analog array (for example, a supporting signed or unsigned input), may be input to the digital computing circuit 430 and be used for a digital operation, or may be input to the in-memory computing circuit 420 and be used for analog computation.

The conversion of input activations into the block floating-point may be performed in real time as a floating-point input feature map IFM is input. A shared exponent representing one input stripe may be determined as a maximum value among the existing exponents of input activations included in the input stripe, but is not limited thereto. A shared exponent may be appropriately determined according to a predefined rule.

Also, as an exponent of an input activation is changed from an existing exponent to a shared exponent, the fraction of the input activation may also be adjusted through a corresponding shift operation. In one example, with respect to an $n^{th}$ layer and an $i^{th}$ input channel, an input activation $X_{n,i}$ converted to a block floating-point may be expressed as Equation 3 below.

$$X_{n,i} = (-1)^{S_x} \times 2^{E_{X_n}} \times F_{x(n,i)} \qquad \text{Equation 3}$$

In Equation 3 above, $S_x$ represents sign bit of an input activation, $E_{X_n}$ represents exponent of an input activation, and $F_{x(n,i)}$ represents fraction of an input activation.

FIG. 7 shows an example in which input activations are converted into a block floating-point format in units of input stripes. For example, if C, which is the number of channels corresponding to one input stripe, is greater than ROW, which is the number of a plurality of row lines of an analog crossbar array included in the in-memory computing circuit 420, the one input stripe may be divided into stripe parts respectively having lengths of C0 and C1 ($C=C_0+C_1$ where $C_0<ROW$, $C_1<ROW$).

In this case, the input activations may be converted into a block floating-point format in units of stripe parts. However, the configuration is not limited thereto, and the input activations may be converted into a block floating-point format in units of input stripes, and may be input only in the in-memory computing circuit 420 in units of stripe parts.

Returning to FIG. 4 again, the at least one control circuit 410 may perform neural network operations using a block floating point format weight and an input activation. For example, the at least one control circuit 410 may perform neural network operation by using the in-memory computing circuit 420 and the digital computing circuit 430.

As described with reference to the in-memory computing circuit 3 of FIG. 3, the in-memory computing circuit 420 may include an analog crossbar array and an ADC. The analog crossbar array may include a plurality of row lines, a plurality of column lines crossing the plurality of row lines, and a plurality of memory cells disposed at intersections of the plurality of row lines and the plurality of column lines.

The at least one control circuit 410 may store a first fraction corresponding to each of the weights included in a weight kernel in memory cells arranged along a column line corresponding to the weight kernel among the plurality of column lines, and may input a second fraction corresponding to each of the input activations included in an input stripe to the plurality of row lines. Accordingly, the analog crossbar array may perform MAC operations with respect to the first fraction (corresponding to a weight) and the second fraction (corresponding to an input activation) in an analog manner, and the result of the MAC operations may be output along the plurality of column lines. The ADC may convert the result of the MAC operation into a digital signal so that a digital operation with respect to the result of the MAC operation is performed by the digital computing circuit 430 later on.

The digital computing circuit 430 may perform an addition operation on the first shared exponent and the second shared exponent, may combine the results of the MAC operation and the result of the addition operation, and may output a partial-sum of floating-point output activations included in a channel of an output feature map. For example, the digital computing circuit 430 may obtain a partial-sum used to calculate a floating-point output activation by combining the result of the MAC operation corresponding to one input stripe and the result of the addition operation. When the partial-sums corresponding to all input stripes included in an input feature map IFM are obtained, the digital computing circuit 430 may calculate a floating-point output activation included in a channel of an output feature map OFM using the obtained partial-sums.

On the other hand, when a weight is expressed as Equation 2 above and an input activation is expressed as Equation 3 above, a partial-sum calculated with respect to the $k^{th}$ weight kernel may be expressed as Equation 4 below.

$$PS_k = 2^{E_{X_n}+E_{W_n}} \times \sum_{i=0}^{ROW-1} (-1)^{S_{x(i)}+S_{W(i)}} \times F_{x(n,i)} \times F_{W(n,i,k)} \quad \text{Equation 4}$$

In Equation 4, $$2^{E_{X_n}+E_{W_n}}$$

may be simply calculated through an addition operation of the digital computing circuit 430. However, in calculation of $$\sum_{i=0}^{ROW-1} (-1)^{S_{x(i)}+S_{W(i)}} \times F_{x(n,i)} \times F_{W(n,i,k)},$$

a sign bit of each weight and input activation should be considered, and thus, $$\sum_{i=0}^{ROW-1} (-1)^{S_{x(i)}+S_{W(i)}} \times F_{x(n,i)} \times F_{W(n,i,k)}$$

may be calculated in different ways depending on whether an analog crossbar array included in the in-memory computing circuit 420 supports signed weights and inputs. Hereinafter, an operation process according to whether an analog crossbar array supports signed weights and inputs will be described in detail with reference to FIGS. 8 to 10.

Figure 8:
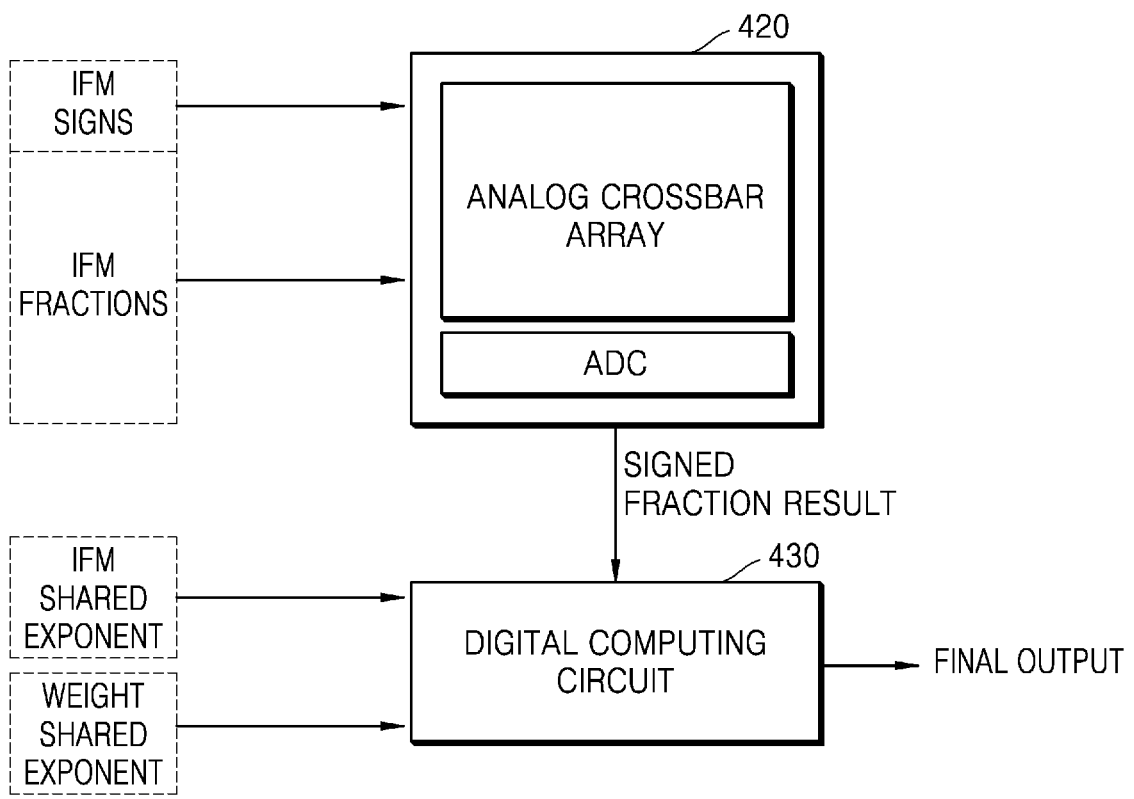
FIG. 8 is a diagram for explaining a process of performing a floating-point operation in which an analog crossbar array supports signed weights and inputs, according to some examples.

FIG. 8 is a diagram for explaining a process of performing a floating-point operation according to some examples in which an analog crossbar array supports signed weights and inputs.

According to some examples, when the analog crossbar array supports signed inputs, the at least one control circuit 410 may input sign bits (e.g., IFM signs) of an input activation of a second block floating-point format to a plurality of row lines together with a second fraction (e.g., IFM Fractions). Also, when the analog crossbar array supports signed weights, the at least one control circuit 410 may store sign bits of weights of a first block floating-point format in a memory cells together with a first fraction.

Since the analog crossbar array supports both signed weights and inputs, by simply inputting the sign bits of the input activation and the weight to the analog crossbar array together with fractions, a MAC operation that considers both the input activation sign and the weight sign may be performed. For example, an output $CO_k$ of the analog crossbar array corresponding to the $k^{th}$ weight kernel may be calculated as Equation 5 below.

$$CO_k = \sum_{i=0}^{ROW-1} (-1)^{S_{x(i)}+S_{W(i)}} \times F_{x(n,i)} \times F_{W(n,i,k)} \quad \text{Equation 5}$$

Figure 9A:
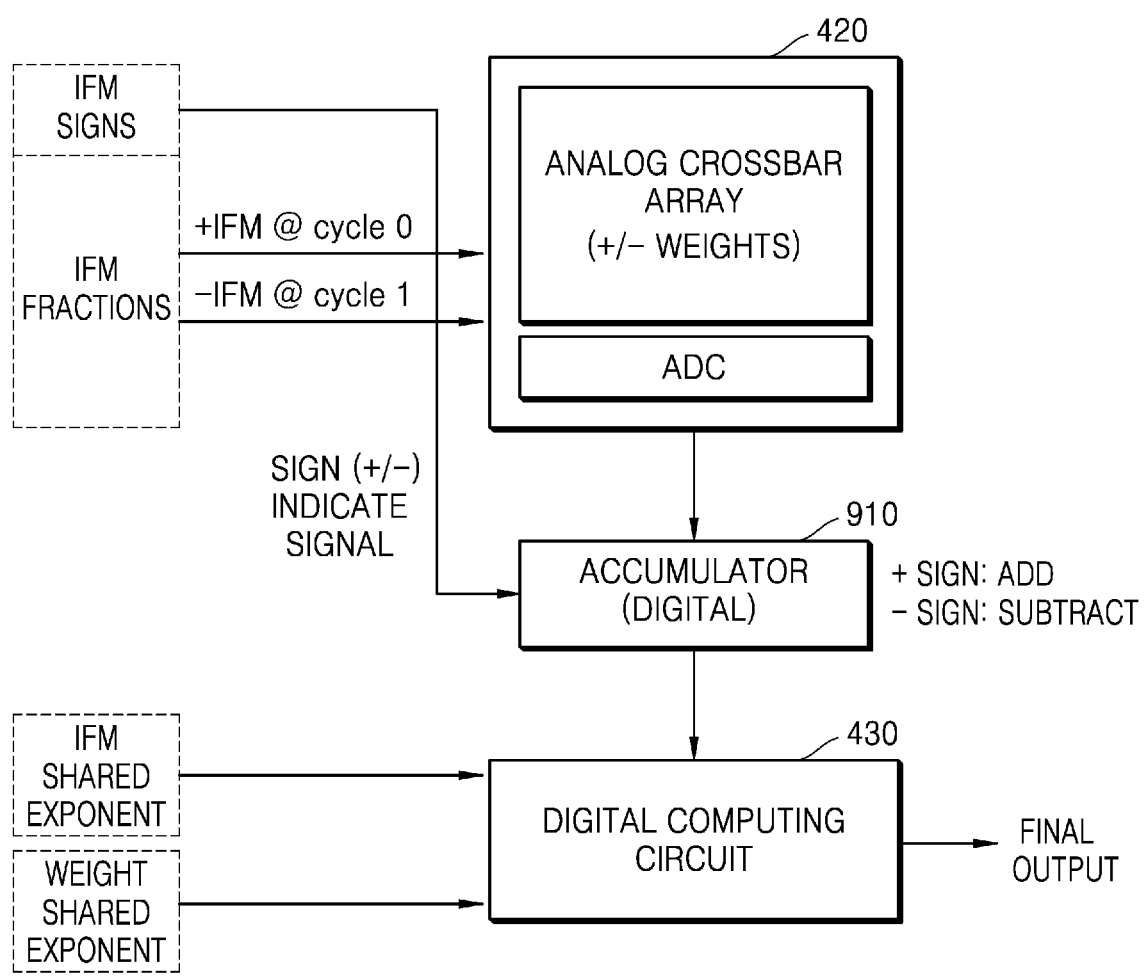
FIGS. 9A and 9B are diagrams for explaining a process of performing a floating-point operation in which an analog crossbar array supports signed weights and supports unsigned inputs, according to some examples.
Figure 9B:
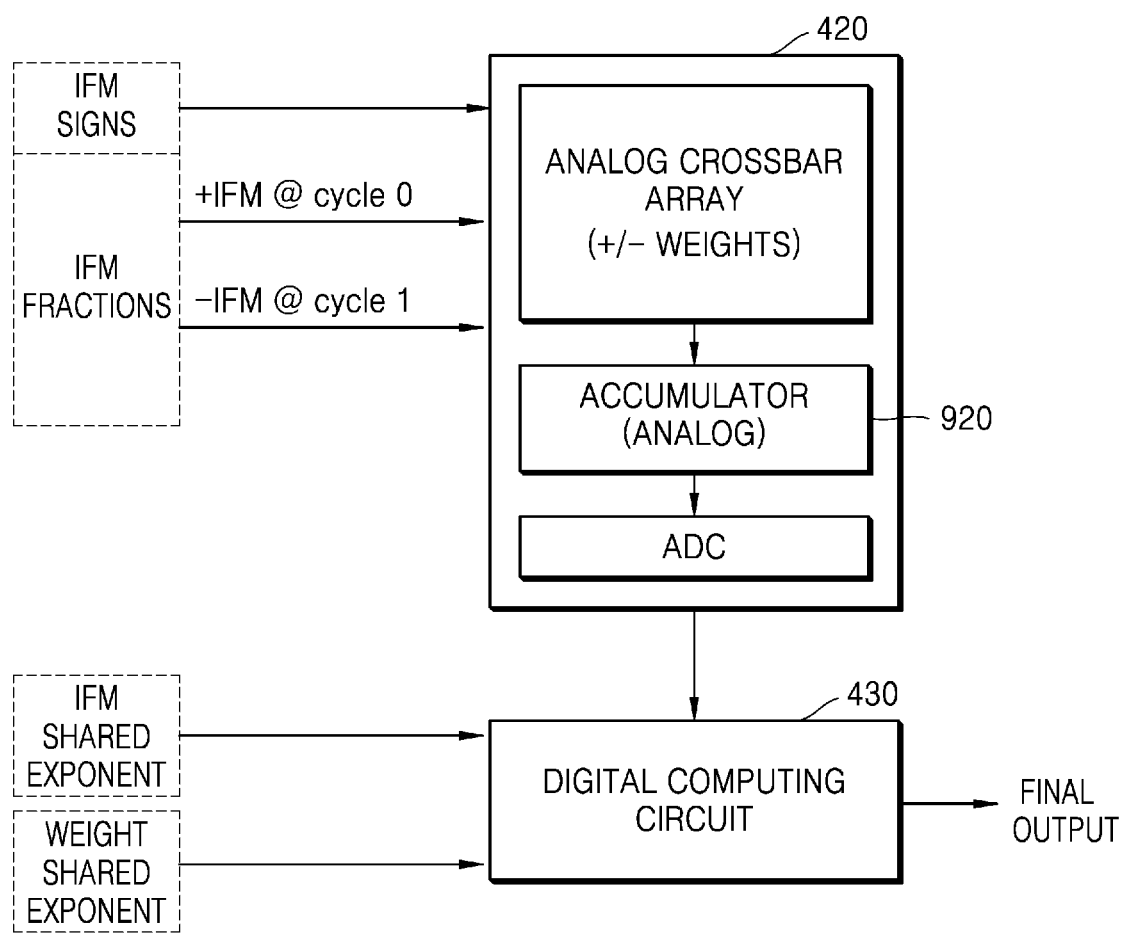

FIGS. 9A and 9B are diagrams for explaining a process of performing a floating-point operation according to some examples in which an analog crossbar array supports a signed weight but supports an unsigned input.

According to some examples, since the analog crossbar array supports the signed weight, as described with reference to FIG. 8 above, the at least one control circuit 410 may store a sign bit of the weight of the first block floating-point format in memory cells together with a first fraction. Accordingly, in the analog crossbar array, both positively signed weights and negatively signed weights may be stored.

On the other hand, when the analog crossbar array supports unsigned input, the at least one control circuit 410 may obtain a first current sum output along each of the column lines by preferentially activating only row lines in which the sign bit of the input activation in a second block floating-point format is a first value. Afterwards, the at least one control circuit 410 may obtain a second current sum output along each of the plurality of column lines by activating only the row lines in which a sign bit of the second block floating-point format input activation is a second value. The first value and the second value may be 0 or 1, and may have different values from each other.

As described above, the at least one control circuit 410 may separately obtain the first current sum corresponding to positive input activations and the second current sum corresponding to negative input activations over at least two cycles (e.g., cycle 0 and cycle 1). Meanwhile, a method of combining the first current sum and the second current sum may be different depending on the configuration of the in-memory computing circuit 420.

In one example, as depicted in FIG. 9A, a digital conversion may be firstly performed before the first current sum and the second current sum are combined. For example, an ADC may convert a first current sum into a first digital signal and a second current sum into a second digital signal. The time when the first current sum is converted into the first digital signal and the time when the second current sum is converted into the second digital signal may be different from each other, but is not limited thereto.

Meanwhile, in the corresponding example, the neural network apparatus may further include a digital accumulator 910. The digital accumulator 910 may output a digital signal corresponding to the result of the MAC operation by combining a first digital signal and a second digital signal. For example, the digital accumulator 910 may combine the first digital signal and the second digital signal by adding the first digital signal corresponding to positive input activations and subtracting the second digital signal corresponding to negative input activations.

In another example, as depicted in FIG. 9B, the combination of the first current sum and the second current sum may be performed prior to digital conversion. In the corresponding example, the neural network apparatus may further include an analog accumulator 920. The analog accumulator 920 may output a final current sum by combining the first current sum and the second current sum. For example, the analog accumulator 920 outputs a final current sum by adding the first current sum corresponding to positive input activations and subtracting the second current sum corresponding to negative input activations. The ADC may convert the final current sum output from the analog accumulator 920 into a digital signal corresponding to the result of the MAC operation.

Meanwhile, in FIG. 9A, it is depicted that the digital accumulator 910 is located outside the in-memory computing circuit 420, and in FIG. 9B, the analog accumulator 920 is located inside the in-memory computing circuit 420, but the configuration is not limited thereto. Each of the digital accumulator 910 and the analog accumulator 920 may be located at any suitable location inside or outside the in-memory computing circuit 420.

Figure 10:
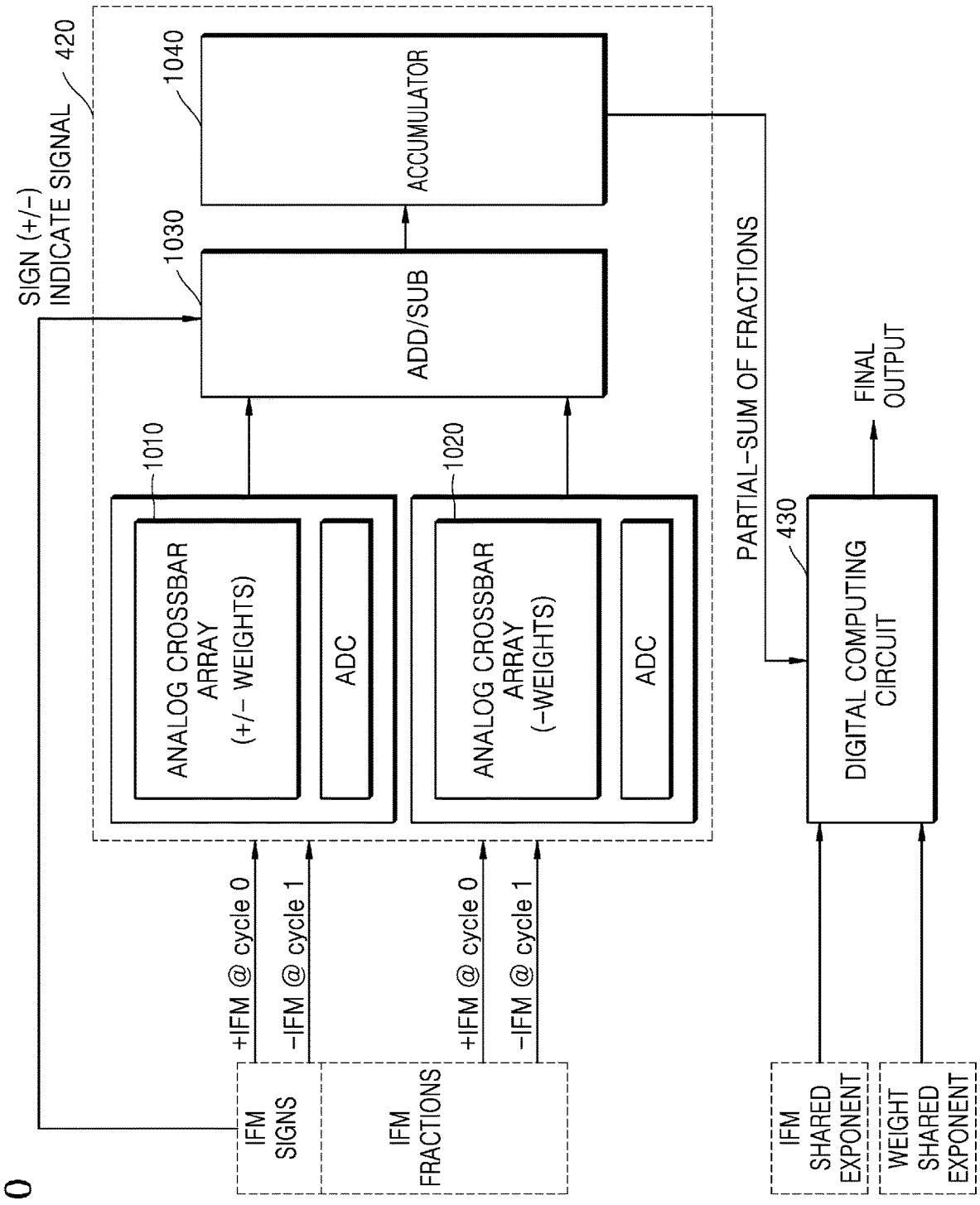
FIG. 10 is a diagram for explaining a process of performing a floating-point operation in which an analog crossbar array supports unsigned inputs and weights, according to some examples.

FIG. 10 is a diagram for explaining a process of performing a floating-point operation according to some examples in which an analog crossbar array supports unsigned inputs and weights.

When the analog crossbar array supports unsigned weights, the at least one control circuit 410 may store a first fraction corresponding to each of the weights, wherein a sign bit of the first fraction is a first value in memory cells arranged along first column lines of the analog crossbar array, and a first fraction corresponding to each of the weights, wherein the sign bit of the first fraction is a second value in memory cells arranged along second column lines of the analog crossbar array.

The in-memory computing circuit 420 may output a final current sum by combining a first current sum output along each of the first column lines and a second current sum output along each of the second column lines. In this way, the analog crossbar array included in the in-memory computing circuit 420 may operate as if it includes two crossbar arrays (i.e., a first crossbar array 1010 storing positive weights and a second crossbar array storing negative weights 1020).

The in-memory computing circuit 420 may output a final current sum by combining the first current sum output along each of the first column lines and the second current sum output along each of the second column lines by using an add/subtract ADD/SUB module 1030. For example, the add/subtract ADD/SUB module 1030 may output the final current sum by adding the first current sum output from the first crossbar array 1010 and subtracting the second current sum output from the second crossbar array 1020.

On the other hand, since the analog crossbar array supports unsigned inputs, as described above with reference to FIGS. 9A and 9B, the at least one control circuit 410 may separately input positive input activations and negative input activations to the in-memory computing circuit 420 over two cycles (i.e., cycle 0 and cycle 1). Accordingly, the final current sum corresponding to positive input activations may be output from the analog crossbar array in cycle 0, and the final current sum corresponding to negative input activations may be output from the analog crossbar array in cycle 1.

An accumulator 1040 may obtain a partial sum of fractions by combining a final current sum corresponding to positive input activations and a final current sum corresponding to negative input activations. For example, the accumulator 1040 may obtain a partial sum of fractions by adding a final current sum corresponding to positive input activations and subtracting a final current sum corresponding to negative input activations.

An example in which an analog crossbar array supports unsigned weights and inputs has been described with reference to FIG. 10, but the analog crossbar array may support unsigned weights, but may also support signed inputs. In this case, since an input over two cycles is not required in consideration of a sign of the input activations, all input activations may be input in one cycle regardless of the sign, and the configuration of the accumulator 1040 may be omitted.

The method of calculating a partial sum of fractions according to whether an analog crossbar array included in the in-memory computing circuit 420 supports signed weights or inputs has been described in detail with reference to FIGS. 8 to 10. The partial sum of fractions output from the analog crossbar array may be input to the digital computing circuit 430 and used to calculate the final output. Hereinafter, a method in which the digital computing circuit 430 calculates a total output will be described in detail with reference to FIG. 11.

Figure 11:
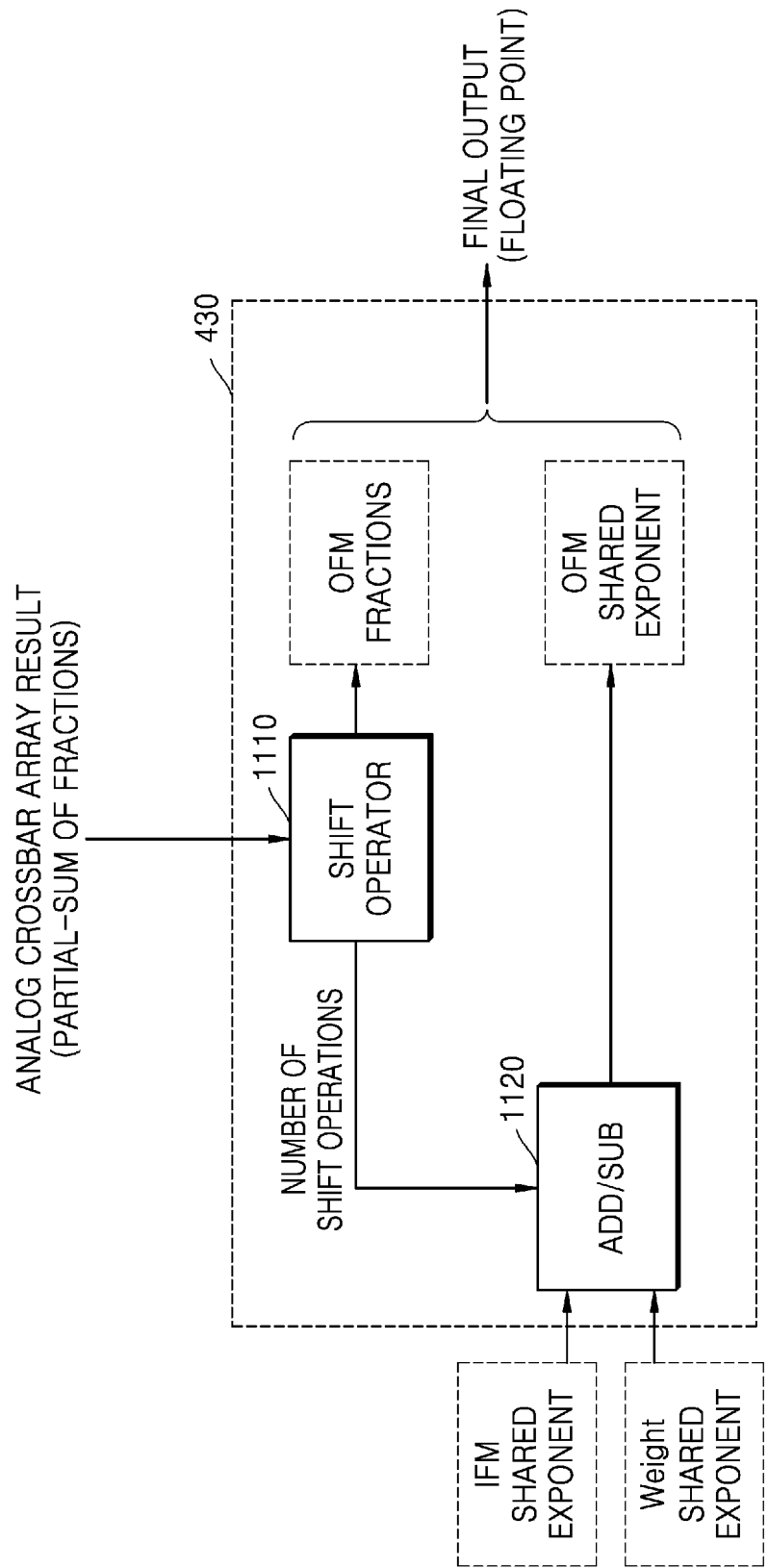
FIG. 11 is a diagram for explaining a process in which a final output of a floating-point operation is output as a result of combining an operation result of an analog crossbar array with an operation result of a digital computing circuit, according to some examples.

FIG. 11 is a diagram for explaining a process in which a final output of a floating-point operation is output as a result of combining an operation result of an analog crossbar array with an operation result of a digital computing circuit, according to some examples.

The digital computing circuit 430 may obtain a third fraction by performing a shift operation so that the most significant bit is 1 with respect to a result of a MAC operation output from the analog crossbar array. The digital computing circuit 430 may include a shift operator 1110 for performing a shift operation. The third fraction on which a shift operation is performed may correspond to a fraction of a partial sum of an output activation.

The digital computing circuit 430 may obtain a third exponent by performing a conversion operation in which the number of times the shift operation is performed ahead is added to or subtracted from the addition result with respect to a first shared exponent (i.e., the shared exponent of the weight) and a second shared exponent (i.e., the shared exponent of the input activation). The third exponent on which the conversion operation is performed may correspond to an exponent of the partial sum of the output activation. Accordingly, the digital computing circuit 430 may output a partial sum of floating-point output activations including the third fraction and the third exponent.

After calculating the partial sum of the output activations corresponding to one input stripe included in the input feature map, the digital computing circuit 430 may sequentially calculate the partial sums of the output activations corresponding to the remaining input stripes. When partial sums corresponding to all input stripes included in the input feature map are calculated, the digital computing circuit 430 may obtain a final output activation based on the calculated partial sums.

Meanwhile, the neural network apparatus may selectively apply an active function in or before the process of obtaining a floating-point output activation by combining the result of the MAC operation and the result of the addition operation in the digital computing circuit 430. In an example, when a ReLU in which 0 is output when a negative number is input is applied as an active function, the neural network apparatus may determine whether an output activation is negative or not based on a sign bit included in the result of the MAC operation, and when the output activation is determined as negative, the neural network apparatus may omit a shift operation and a conversion operation and output an output activation as 0. Accordingly, unnecessary computations and operations may be omitted.

The floating-point output activation finally output from the digital computing circuit 430 may be used as an input activation of the next layer. The processes described above may be repeated in the next layer, and a forward pass or a backward pass may be performed along layers of the neural network implemented by the neural network apparatus. Also, as the forward pass or the backward pass is performed, training about a neural network implemented by the neural network apparatus may be performed, or inference using the neural network may be performed.

The neural network apparatus according to the present examples, after converting input activations and weights into a block floating point format, digitally performs an operation with respect to an exponent in which accuracy is important, and uses an existing fixed-point based analog crossbar array on an operation with respect to a fraction that requires a lot of operations, and thus may perform floating-point operations with minimal loss of power and accuracy.

Figure 12:
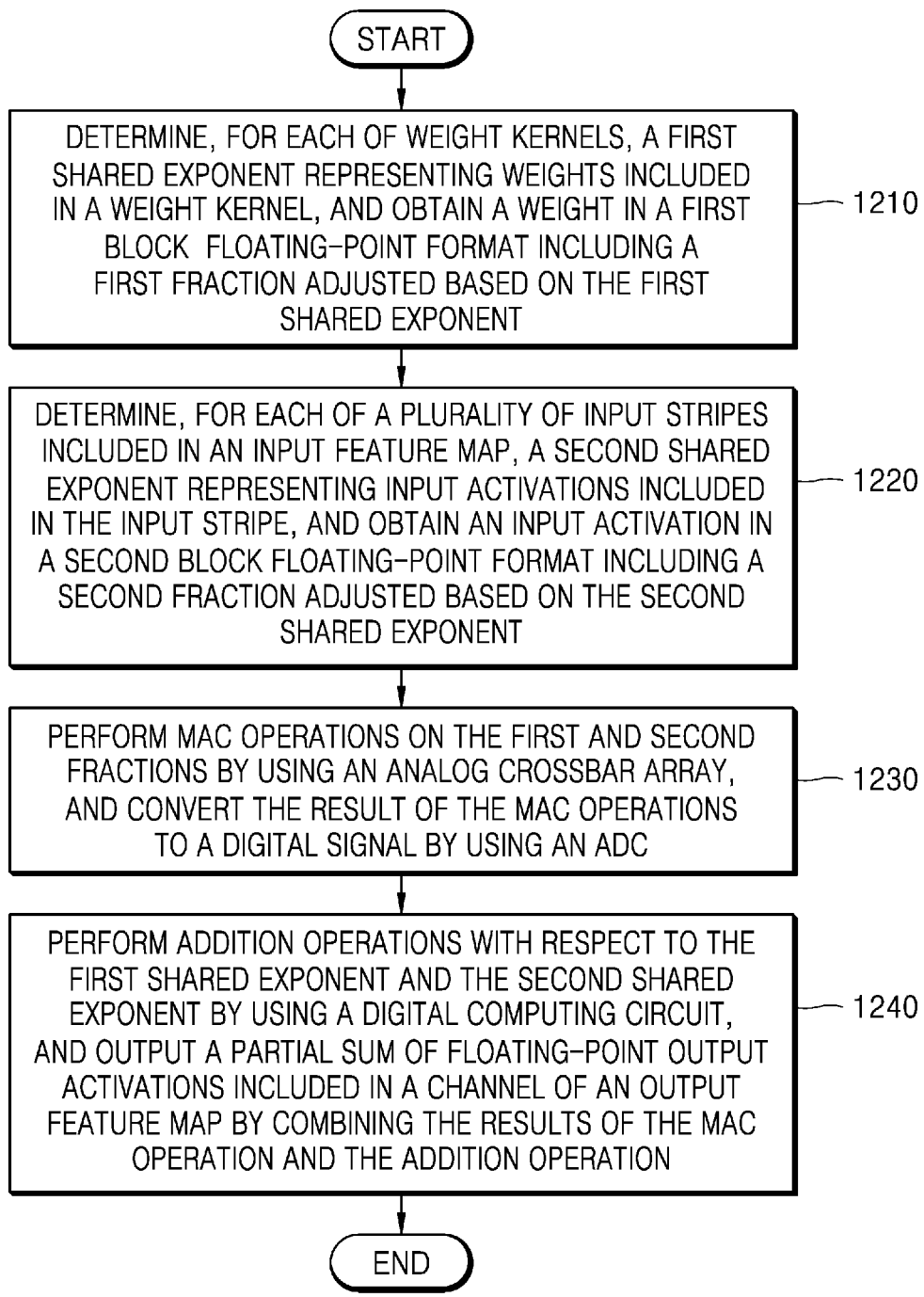
FIG. 12 is a flowchart illustrating an operating method of a neural network apparatus according to some examples.

FIG. 12 is a flowchart illustrating a method of operating a neural network apparatus according to some examples.

Referring to FIG. 12, the method of operating a neural network apparatus includes operations processed in time series in the neural network apparatus 4 shown in FIG. 4. Accordingly, it may be seen that the descriptions given with respect to FIGS. 4 through 11, even though omitted below, may be applied to the method of operating the neural network apparatus of FIG. 12.

In operation 1210, the neural network apparatus may determine, for each of weight kernels, a first shared exponent representing weights included in a weight kernel, and obtain a weight in a first block floating-point format including a first fraction adjusted based on the first shared exponent.

In operation 1220, the neural network apparatus may determine, for each of a plurality of input stripes included in an input feature map, a second shared exponent representing input activations included in the input stripe, and obtain an input activation in a second block floating-point format including a second fraction adjusted based on the second shared exponent.

In operation 1230, the neural network apparatus may perform MAC operations on the first and second fractions by using an analog crossbar array, and convert the result of the MAC operations to a digital signal by using an ADC.

The neural network apparatus may store a first fraction corresponding to each of the weights included in the weight kernel in memory cells arranged along a column line corresponding to the weight kernel among a plurality of column lines of the analog crossbar array. Also, the neural network apparatus may input a second fraction corresponding to each of the input activators included in the input stripe to a plurality of row lines of the analog crossbar array. Accordingly, MAC operations on the first fraction and the second fraction may be performed in an analog manner.

According to some examples, when the analog crossbar array supports signed input, the neural network apparatus may input a sign bit of an input activation in a second block floating-point format to the plurality of row lines together with the second fraction. Accordingly, a result of the MAC operation may be output from the analog crossbar array by considering the sign bit of the input activation.

However, according to another example, when the analog crossbar array supports an unsigned input, the neural network apparatus may obtain a first current sum output along each of the column lines by preferentially activating only row lines in which the sign bit of the input activation in a second block floating-point format is a first value. Thereafter, the neural network apparatus may obtain a second current sum output along each of the plurality of column lines by activating only the low lines in which the sign bit of the input activation in a second block floating-point format is the second value. The first value and the second value may be 0 or 1, and may have different values from each other.

As described above, the neural network apparatus may separately obtain the first current sum corresponding to positive input activations and the second current sum corresponding to negative input activations over at least two cycles. Meanwhile, a method of combining the first current sum and the second current sum may be different depending on the configuration of the in-memory computing circuit including the analog crossbar array.

In one example, the neural network apparatus may first perform digital conversion before the first current sum and the second current sum are combined. The neural network apparatus may convert the first current sum into a first digital signal by using an ADC and convert the second current sum into a second digital signal by using an ADC. The neural network apparatus may output a digital signal corresponding to the result of the MAC operation by combining the first digital signal and the second digital signal by using a digital accumulator. In an example in which the first value is 0 and the second value is 1, the neural network apparatus may output a digital signal corresponding to the result of the MAC operation by subtracting the second digital signal from the first digital signal.

In another example, the neural network apparatus may perform a combination of the first current sum and the second current sum before digital conversion. The neural network apparatus may output a final current sum by combining the first current sum and the second current sum by using an analog accumulator. In an example in which the first value is 0 and the second value is 1, the neural network apparatus may output a final current sum by subtracting the second current sum from the first current sum. The neural network apparatus may convert, by using an ADC, the final current sum into a digital signal corresponding to the result of the MAC operation.

According to some examples, when a crossbar array supports signed weights, the neural network apparatus may store sign bits of weights of a first block floating-point format in the memory cells together with the first fraction. Accordingly, a result of the MAC operation may be output from the analog crossbar array by considering the sign bit of the weight.

According to another example, when the analog crossbar array supports unsigned weights, the neural network apparatus may store a first fraction corresponding to each of the weights, wherein a sign bit of the first fraction is a first value in memory cells arranged along first column lines of the analog crossbar array, and a first fraction corresponding to each of the weights, wherein the sign bit of the first fraction is a second value in memory cells arranged along second column lines of the analog crossbar array. The first value and the second value may be 0 or 1, and may have different values.

The neural network apparatus may output a final current sum by combining the first current sum output along each of the first column lines and the second current sum output along each of the second column lines. As described above, the analog crossbar array included in the neural network apparatus may be operated as if it includes two crossbar arrays (that is, a first crossbar array in which a sign bit of the weight is a first value and a second crossbar array in which a sign bit of the weight is a second value).

In operation 1240, the neural network apparatus may perform addition operations with respect to the first shared exponent and the second shared exponent by using a digital computing circuit, and output a partial sum of floating-point output activations included in a channel of an output feature map by combining the results of the MAC operation and the addition operation.

For example, the neural network apparatus may obtain a third fraction by performing a shift operation so that the most significant bit is 1 with respect to the result of the MAC operation. In addition, the neural network apparatus may obtain a third fraction by performing a conversion operation in which the number of times the shift operation is performed is added to or subtracted from the result of the addition operation. Accordingly, the neural network apparatus may output a partial sum of the floating-point output activation including the third fraction and the third exponent.

After calculating the partial sum of the output activation corresponding to one input stripe included in the input feature map, the neural network apparatus may sequentially calculate partial sums of the output activations corresponding to the remaining input stripes. When the partial sums corresponding to all the input stripes included in the input feature map are calculated, the neural network apparatus may obtain a final output activation based on the calculated partial sums.

The neural network apparatus may selectively apply an active function in or before the process of obtaining a floating-point output activation by combining the result of the MAC operation and the result of the addition operation. In an example, when a ReLU in which 0 is output when a negative number is input is applied as an active function, the neural network apparatus may determine whether an output activation is negative or not based on a sign bit included in the result of the MAC operation, and when the output activation is determined as being negative, the neural network apparatus may omit a shift operation and a conversion operation and output an output activation as 0. Accordingly, unnecessary computations and operations may be omitted.

In the operating method of the neural network apparatus according to the examples, after converting input activations and weights into a block floating point format, an operation with respect to an exponent of which accuracy is important is digitally performed, and in an operation with respect to a fraction that requires a lot of operations, an existing fixed-point based analog crossbar array is used, and thus, a floating-point operations may be performed with minimal loss of power and accuracy.

Meanwhile, the operations in FIG. 12 are only sequentially described in order to explain an overall flow of the method of operating the neural network apparatus, and thus, may not necessarily be performed in the order described. For example, after operation 1210 is performed and operations 1220 to 1240 are performed with respect to one input stripe included in an input feature map, operation 1210 may not be performed again. Instead of performing operation 1210 again, operations 1220 to 1240 may be repeatedly performed with respect to remaining input stripes included in the input feature map.

Also, as operations 1220 to 1240 are performed with respect to all input stripes included in one input feature map, after an output activation corresponding to the corresponding input feature map is output, even when a floating-point operation for outputting an output activation corresponding to another input feature map is started, operation 1210 may be omitted. For example, in a process of performing a floating-point operation on all input feature maps, the operation 1210 may be performed only once in the first time. However, this is only an example, and the operation 1210 may be performed again at any point of time when a change in weights used for floating-point operations is required. Also, each of the operations 1220 to 1240 may be performed at an appropriate time depending on the situation.

Figure 13:
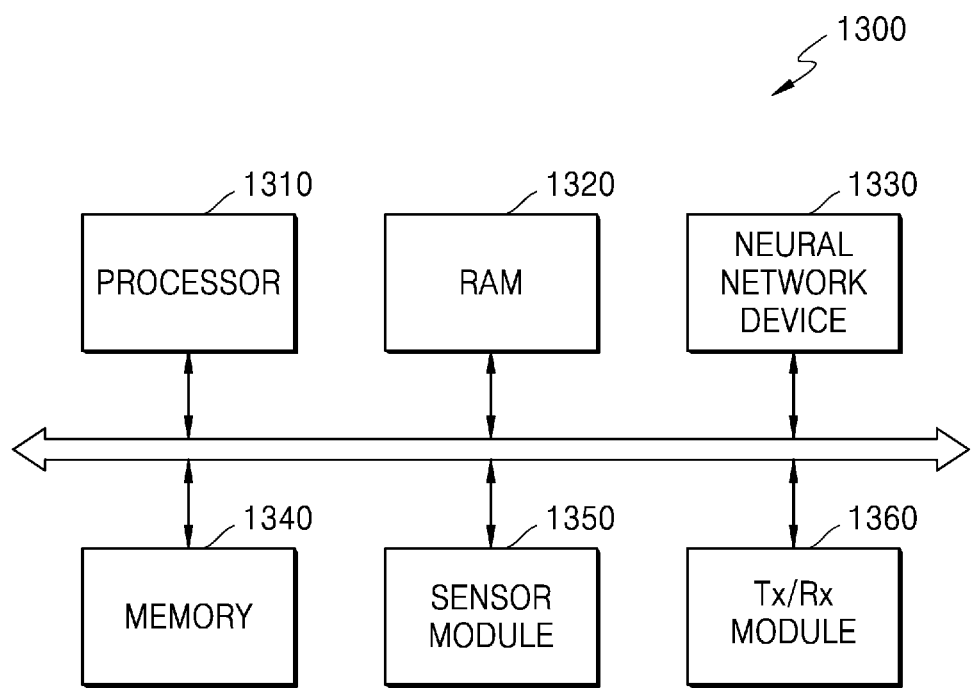
FIG. 13 is a block diagram illustrating a configuration of an electronic system according to some examples.

FIG. 13 is a block diagram illustrating a configuration of an electronic system according to some examples.

Referring to FIG. 13, the electronic system 1300 may extract valid information by analyzing input data in real time based on a neural network and determine a situation or control the configuration of a device on which the electronic system 1300 is mounted based on the extracted information. For example, the electronic system 1300 may be applied to a robotic device, such as a drone or an advanced driver assistance system (ADAS), a smart TV, a smart phone, a medical device, a mobile device, an image display device, a measurement device, an IoT device and may be mounted on at least one of various types of electronic devices.

The electronic system 1300 may include a processor 1310, a RAM 1320, a neural network device 1330, a memory 1340, a sensor module 1350, and a communication module 1360. The electronic system 1300 may further include an input/output module, a security module, and a power control device. Some of hardware components of the electronic system 1300 may be mounted on at least one semiconductor chip.

The processor 1310 controls an overall operation of the electronic system 1300. The processor 1310 may include a single processor core (Single Core) or a plurality of processor cores (Multi-Core). The processor 1310 may process or execute programs and/or data stored in the memory 1340. In some examples, the processor 1310 may control functions of the neural network device 1330 by executing programs stored in the memory 1340. The processor 1310 may be implemented by a CPU, GPU, AP, etc.

The RAM 1320 may temporarily store programs, data, or instructions. For example, programs and/or data stored in the memory 1340 may be temporarily stored in the RAM 1320 according to the control or booting code of the processor 1310. The RAM 1320 may be implemented as a memory, such as dynamic RAM (DRAM) or static RAM (SRAM).

The neural network device 1330 may perform an operation of the neural network based on received input data and generate an information signal based on the execution result. Neural networks may include convolution neural networks (CNN), recurrent neural networks (RNN), deep belief networks, restricted Boltzmann machines, etc., but are not limited thereto. The neural network device 1330 may be a hardware accelerator dedicated to the neural network or a device including the same, and may correspond to the neural network apparatus described above (for example, the neural network apparatus 4 of FIG. 4).

The neural network device 1330 may perform floating point operations while utilizing an in-memory computing circuit capable of significantly reducing power consumption. Also, the neural network device 1330 may minimize the loss of accuracy by digitally processing the operation with respect to an exponent that is sensitive to errors.

An information signal may include one of various types of recognition signals, such as a voice recognition signal, an object recognition signal, an image recognition signal, and a biometric information recognition signal. For example, the neural network device 1330 may receive frame data included in a video stream as input data and generate, on the basis of the frame data, a recognition signal with respect to an object included in an image displayed by the frame data. However, the configuration is not limited thereto, and the neural network device 1330 may receive various types of input data according to the type or function of an electronic device on which the electronic system 1300 is mounted and generate a recognition signal according to the input data.

The memory 1340 is a storage for storing data and may store an operating system (OS), various programs, and various data. In an embodiment, the memory 1340 may store intermediate results generated in a process of performing an operation of the neural network device 1330.

The memory 1340 may be DRAM, but is not limited thereto. The memory 1340 may include at least one of volatile memory and nonvolatile memory. The non-volatile memory includes ROM, PROM, EPROM, EEPROM, flash memory, PRAM, MRAM, RRAM, FRAM, etc. The volatile memory includes DRAM, SRAM, SDRAM, PRAM, MRAM, RRAM, FeRAM, etc. In an embodiment, the memory 1340 may include at least one of HDD, SSD, CF, SD, Micro-SD, Mini-SD, xD and Memory Stick.

The sensor module 1350 may collect information around an electronic device on which the electronic system 1200 is mounted. The sensor module 1350 may sense or receive a signal (e.g., an image signal, a voice signal, a magnetic signal, a bio signal, a touch signal, etc.) from the outside of the electronic device and convert the sensed or received signal into data. To this end, the sensor module 1250 may include at least one of various types of sensing devices, for example, a microphone, an imaging device, an image sensor, a light detection and ranging (LiDAR) sensor, an ultrasonic sensor, an infrared sensor, a bio sensor, and a touch sensor.

The sensor module 1350 may provide converted data as input data to the neural network device 1330. For example, the sensor module 1350 may include an image sensor, generate a video stream by photographing an external environment of the electronic device, and sequentially provide successive data frames of the video stream to the neural network device 1330 as input data. However, the configuration is not limited thereto, and the sensor module 1350 may provide various types of data to the neural network device 1330.

The communication module 1360 may include various wired or wireless interfaces capable of communicating with external devices. For example, the communication module 1360 may include a local area network (LAN), a wireless LAN (WLAN), such as Wi-Fi, a wireless personal area network (WPAN), such as Bluetooth, a wireless universal serial bus (USB), ZigBee, near-field communication (NFC), radio-frequency identification (RFID), power-line communication (PLC), or a communication interface capable of connecting to a mobile cellular network, such as 3rd generation (3G), 4th generation (4G), or long-term evolution (LTE).

Examples may be implemented as a computer-readable program, and may be realized in general computers that execute the program by using non-transitory computer-readable recording media. In addition, the structure of data used in the embodiments of the inventive concept may be recorded on a non-transitory computer-readable recording medium through various means. The non-transitory computer-readable medium may be magnetic storage media (e.g., ROM, floppy disks, hard disks, etc.) and optical recording media (e.g., CD-ROMs or DVDs).

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An operating method of a neural network apparatus performing a floating-point operation, wherein a floating-point value is specified by a sign bit, a fraction and an exponent, the operating method comprising, for each weight kernel of a plurality of weight kernels and for each input stripe of a plurality of input stripes of an input feature map:
   determining, for the weight kernel, a first shared exponent for representing a group of weight kernels and weights included in the group of weight kernels and obtaining converted weights in a first block floating-point format, each converted weight including a first fraction adjusted based on the first shared exponent, wherein a number of groups of weight kernels is determined through simulation in advance;
   determining, for the input stripes, a second shared exponent for representing the input activations included in the input stripe and obtaining converted input activations in a second block floating-point format, each converted input activation including a second fraction adjusted based on the second shared exponent;
   performing a multiply-accumulate (MAC) operation with respect to the first fraction of each converted weight and the second fraction of each converted input activation using an analog crossbar array and converting the result of the MAC operation into a digital signal using an analog-digital converter (ADC); and
   performing an addition operation on the first shared exponent and the second shared exponent using a digital computing circuit and outputting a partial sum for calculating a floating-point output activation included in a channel of an output feature map by combining the digital signal from the MAC operation and the result of the addition operation.

2. The operating method of claim 1, further comprising storing the first fraction corresponding to each of the weights included in the respective weight kernel in memory cells arranged along a column line corresponding to the respective weight kernel among a plurality of column lines of the analog crossbar array; and
   inputting the second fraction corresponding to each of the input activations included in the respective input stripe to a plurality of row lines of the analog crossbar array.

3. The operating method of claim 2, further comprising, in a case in which the analog crossbar array supports a signed input, inputting a sign bit of the second block floating-point input activation to the plurality of row lines together with the second fraction.

4. The operating method of claim 2, further comprising:
   in a case in which the analog crossbar array supports an unsigned input,
   obtaining a first current sum output along each of the plurality of column lines by activating only the row lines in which a sign bit of an input activation of the second block floating-point format is a first value; and
   obtaining a second current sum output along each of the plurality of column lines by activating only the row lines in which a sign bit of an input activation of the second block floating point format is a second value.

5. The operating method of claim 4, further comprising:
   converting the first current sum into a first digital signal using the ADC;
   converting the second current sum into a second digital signal using the ADC; and outputting the digital signal corresponding to the result of the MAC operations by combining the first digital signal and the second digital signal using a digital accumulator.

6. The operating method of claim 4, further comprising:
outputting a final current sum by combining the first current sum and the second current sum using an analog accumulator; and
converting the final current sum into the digital signal corresponding to the result of the MAC operations using the ADC.

7. The operating method of claim 2,
in a case in which the analog crossbar array supports signed weights, storing the first fraction comprises:
storing a sign bit of a weight of the first block floating-point format in the memory cells together with the first fraction.

8. The operating method of claim 2, further comprising:
in a case in which the analog crossbar array supports unsigned weights,
storing a first fraction corresponding to each of the weights, wherein the sign bit of the first fraction is a first value in memory cells arranged along the first column lines of the analog crossbar array;
storing a first fraction corresponding to each of the weights, wherein the sign bit of the first fraction is a second value in memory cells arranged along second column lines of the analog crossbar array; and
outputting a final current sum by combining a first current sum output along each of the first column lines and a second current sum output along each of the second column lines.

9. The operating method of claim 1, wherein the outputting the partial sum comprises:
obtaining a third fraction by performing a shift operation so that the most significant bit is 1 with respect to the result of the MAC operations;
obtaining a third exponent by performing a conversion operation in which a number of times the shift operation is performed is added to or subtracted from the result of the addition operations; and
outputting a partial sum of the floating-point output activation including the third fraction and the third exponent.

10. The operating method of claim 9, further comprising:
determining whether the floating-point output activation is negative based on a sign bit included in the result of the MAC operations; and
in response to the floating-point output activation being determined as negative, omitting the shift operation and the conversion operation and outputting the floating-point output activation as 0.

11. A neural network apparatus for performing a floating-point operation for each weight kernel of a plurality of weight kernels and for each input stripe of a plurality of input stripes of an input feature map, wherein a floating-point value is specified by a sign bit, a fraction and an exponent, the neural network apparatus comprising:
at least one control circuit configured to determine, for the weight kernel, a first shared exponent for representing a group of weight kernels and weights included in the group of weight kernels and to obtain converted weights in a first block floating-point format, each converted weight including a first fraction adjusted based on the first shared exponent, wherein a number of groups of weight kernels is determined through simulation in advance, and to determine, for the input stripe,
a second shared exponent for representing input activations included in the input stripe and to obtain converted input activations in a second block floating-point format, each converted input activation including a second fraction adjusted based on the second shared exponent;
an in-memory computing circuit comprising an analog crossbar array configured to perform a multiply-accumulate (MAC) operation with respect to the first fraction of each converted weight and the second fraction of each converted input activation and an analog-digital converter (ADC) configured to convert the result of the MAC operation into a digital signal; and
a digital computing circuit configured to perform an addition operation on the first shared exponent and the second shared exponent and to output a partial sum for calculating a floating-point output activation included in a channel of an output feature map by combining the digital signal from the MAC operation and the result of the addition operation.

12. The neural network apparatus of claim 11, wherein the analog crossbar array comprises:
a plurality of row lines;
a plurality of column lines crossing the plurality of row lines; and
a plurality of memory cells disposed at intersections of the plurality of row lines and the plurality of column lines, wherein
the at least one control circuit is configured to:
store the first fraction corresponding to each of the weights included in the weight kernel in memory cells arranged along a column line among the plurality of column lines corresponding to the respective weight kernel, and input a second fraction corresponding to each of the input activations included in the respective input stripe to the plurality of row lines.

13. The neural network apparatus of claim 12, wherein, in a case in which the analog crossbar array supports signed input, the at least one control circuit is configured to input a sign bit of an input activation in a second block floating-point format to the plurality of row lines together with the second fraction.

14. The neural network apparatus of claim 12, wherein,
in a case in which the analog crossbar array supports unsigned input, the at least one control circuit is configured to obtain a first current sum output along each of the plurality of column lines by activating only the row lines in which a sign bit of the input activation of the second block floating-point format is a first value, and a second current sum output along each of the plurality of column lines by activating only the row lines in which a sign bit of the input activation of the second block floating-point format is a second value.

15. The neural network apparatus of claim 14, wherein the ADC is configured to
convert the first current sum into a first digital signal and convert the second current sum into a second digital signal, and
the neural network apparatus further comprises a digital accumulator configured to output the digital signal corresponding to the result of the MAC operations by combining the first digital signal and the second digital signal.

16. The neural network apparatus of claim 14, wherein the neural network apparatus further comprises:

an analog accumulator configured to output a final current sum by combining the first current sum and the second current sum, and the ADC is configured to convert the final current sum into the digital signal corresponding to the result of the MAC operations.

17. The neural network apparatus of claim 12, wherein, in a case in which the analog crossbar array supports signed weights, the at least one control circuit is configured to:

store a sign bit of a weight of the first block floating-point format in the memory cells together with the first fraction.

18. The neural network apparatus of claim 12, wherein, in a case in which the analog crossbar array supports unsigned weights, the at least one control circuit is configured to:

store a first fraction corresponding to each of the weights in which a sign bit is a first value in memory cells arranged along the first column lines of the analog crossbar array, and store a first fraction corresponding to each of the weights in which a sign bit is a second value in the memory cells arranged along the second column lines of the analog crossbar array, and the in-memory computing circuit is configured to:

output a final current sum by combining a first current sum output along each of the first column lines and a second current sum output along each of the second column lines.

19. The neural network apparatus of claim 11, wherein the digital computing circuit is configured to:

obtain a third fraction by performing a shift operation so that the most significant bit is 1 with respect to the result of the MAC operations, obtain a third exponent by performing a conversion operation in which a number of times the shift operation is performed is added to or subtracted from the addition operation, and obtain a partial sum of the floating-point output activation including the third fraction and the third exponent.

20. The neural network apparatus of claim 19, wherein the digital computing circuit is configured to:

determine whether the floating-point output activation is negative based on a sign bit included in the result of the MAC operations, and in response to the floating-point output activation being determined as negative, omit the shift operation and the conversion operation and output the floating-point output activation as 0.

21. The neural network apparatus of claim 11, wherein the first shared exponent is a maximum value among existing exponents of the weights.

22. The neural network apparatus of claim 11, further comprising an accumulator configured to combine a first digital signal corresponding to a positive input activation and a second digital signal corresponding to a negative input activation.

23. The neural network apparatus of claim 22, wherein the accumulator is an analog accumulator included in the in-memory computing circuit.

24. The neural network apparatus of claim 22, wherein the accumulator is a digital accumulator included in the digital computing circuit.

* * * * *